(12) United States Patent  (10) Patent No.: US 8,256,737 B2
Stango  (45) Date of Patent: Sep. 4, 2012

(54) LEVERAGE DEVICE AND SYSTEM USING SAME

(75) Inventor: James Christopher Stango, Chicago, IL (US)

(73) Assignee: Southco, Inc., Concordville, PA (US)

( * ) Notice: Subject to any disclaimer, the term of this patent is extended or adjusted under 35 U.S.C. 154(b) by 298 days.

(21) Appl. No.: 12/404,278

(22) Filed: Mar. 13, 2009

(65) Prior Publication Data
US 2009/0230279 A1 Sep. 17, 2009

Related U.S. Application Data

(60) Provisional application No. 61/036,921, filed on Mar. 14, 2008.

(51) Int. Cl.
 *F16M 13/00* (2006.01)
 *F16M 1/00* (2006.01)
 *F16M 5/00* (2006.01)
 *F16M 7/00* (2006.01)
(52) U.S. Cl. .............. 248/642; 248/274.1; 248/276.1
(58) Field of Classification Search .............. 318/568.1; 248/642, 274.1, 276.1, 284.1; 340/686.4; 70/277; 361/685, 798, 801, 740
See application file for complete search history.

(56) References Cited

U.S. PATENT DOCUMENTS

| | | |
|---|---|---|
| 2,514,246 A | 7/1950 | Knox |
| 2,609,268 A | 9/1952 | Nye |
| 2,716,262 A | 8/1955 | Oswald |
| 2,829,914 A | 4/1958 | Peras |
| 2,897,033 A | 7/1959 | Ford |
| 2,944,864 A | 7/1960 | Krivulka |
| 3,140,905 A | 7/1964 | Trotter et al. |
| 3,190,713 A | 6/1965 | Vander Sande et al. |
| 3,193,342 A | 7/1965 | Sauter |
| 3,262,726 A | 7/1966 | Phelps |
| 3,424,111 A * | 1/1969 | Maslow ............ 108/147.13 |
| 3,446,524 A | 5/1969 | Barry |
| 3,563,628 A | 2/1971 | Poe |
| 3,575,482 A | 4/1971 | MacMaster et al. |
| 3,619,019 A | 11/1971 | Hepker |
| 3,640,141 A | 2/1972 | Hollingsead et al. |
| 3,924,884 A | 12/1975 | Christie |
| 3,936,086 A | 2/1976 | Berkowitz |
| 4,002,386 A | 1/1977 | McKenzie |
| 4,003,614 A | 1/1977 | Geer et al. |
| 4,018,091 A | 4/1977 | Hollingsead et al. |
| 4,230,351 A | 10/1980 | Bisbing |
| 4,236,190 A | 11/1980 | Hollingsead et al. |
| 4,256,356 A | 3/1981 | Roth |
| 4,301,494 A | 11/1981 | Jordan |
| 4,534,234 A | 8/1985 | Cosenza |
| 4,691,952 A | 9/1987 | Harmon |
| RE32,546 E | 11/1987 | Roake |

(Continued)

OTHER PUBLICATIONS

Drawings of insertion/extraction handle concepts for line replaceable units, 10 sheets.

*Primary Examiner* — Amy Sterling
(74) *Attorney, Agent, or Firm* — Paul & Paul

(57) ABSTRACT

The present invention relates to a leverage device for leveraging a first member into a final position relative to a second member. Also disclosed is a leverage system that uses the leverage device. The leverage device of the present invention at least includes a mounting bracket, an actuating lever, a first linkage member, a second linkage member, and a cam.

8 Claims, 59 Drawing Sheets

U.S. PATENT DOCUMENTS

| | | |
|---|---|---|
| 4,718,632 A | 1/1988 | Meineke |
| 4,830,530 A | 5/1989 | Meineke |
| 4,914,550 A | 4/1990 | Filsinger et al. |
| 4,931,907 A | 6/1990 | Robinson et al. |
| RE33,283 E | 7/1990 | Hollingsead et al. |
| 4,982,303 A | 1/1991 | Krenz |
| 5,002,418 A | 3/1991 | McCown et al. |
| 5,045,960 A | 9/1991 | Eding |
| 5,375,894 A | 12/1994 | Schlack |
| 5,504,656 A | 4/1996 | Joist |
| 5,557,499 A | 9/1996 | Reiter et al. |
| 5,791,753 A | 8/1998 | Paquin |
| 5,829,994 A | 11/1998 | Oda et al. |
| 5,947,572 A | 9/1999 | Chang |
| 5,949,652 A | 9/1999 | McAnally et al. |
| 6,099,330 A | 8/2000 | Gundermann et al. |
| 6,134,115 A | 10/2000 | Sim et al. |
| 6,147,872 A | 11/2000 | Roy |
| 6,203,076 B1 | 3/2001 | Wytcherley et al. |
| 6,252,514 B1 | 6/2001 | Nolan et al. |
| 6,266,248 B1 | 7/2001 | Hanas et al. |
| 6,317,967 B1 | 11/2001 | Sampson |
| 6,354,164 B1 | 3/2002 | Megason et al. |
| 6,374,460 B1 | 4/2002 | Edevold et al. |
| 6,406,312 B1 | 6/2002 | Heitkamp |
| 6,421,236 B1 | 7/2002 | Montoya et al. |
| 6,523,870 B2 | 2/2003 | Schlack |
| 6,549,424 B1 | 4/2003 | Beseth et al. |
| 6,565,135 B2 | 5/2003 | Wytcherley et al. |
| 6,641,482 B2 | 11/2003 | Masuyama et al. |
| 6,646,883 B2 | 11/2003 | Salinas |
| 6,654,253 B1 | 11/2003 | DiMarco |
| 6,680,851 B1 | 1/2004 | Fasullo et al. |
| 6,774,808 B1 * | 8/2004 | Hibbs et al. ................ 340/686.4 |
| 6,851,867 B2 | 2/2005 | Pang et al. |
| 6,955,550 B2 | 10/2005 | Schlack |
| 6,975,519 B2 | 12/2005 | Siahpolo et al. |
| 6,991,471 B2 | 1/2006 | Hayashi et al. |
| 7,027,309 B2 | 4/2006 | Franz et al. |
| 7,172,441 B2 | 2/2007 | Schlack |
| 7,210,751 B2 | 5/2007 | Nakayama |
| 7,307,851 B2 | 12/2007 | Dimarco |
| 7,397,674 B2 | 7/2008 | Schlack |
| 7,417,866 B1 | 8/2008 | Beseth et al. |
| 7,463,494 B2 | 12/2008 | Downing et al. |
| 7,511,953 B2 | 3/2009 | Tao et al. |
| 7,675,754 B2 | 3/2010 | Barina et al. |
| 2001/0012712 A1 | 8/2001 | Nishioka |

* cited by examiner

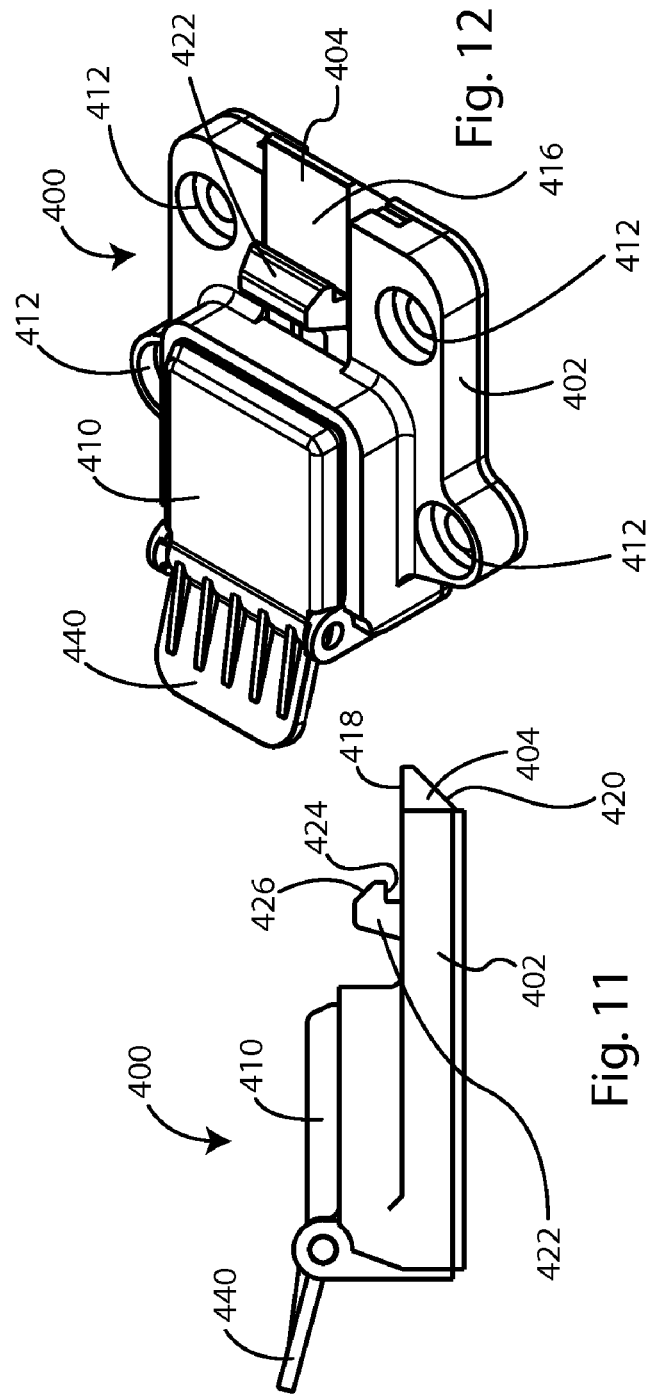

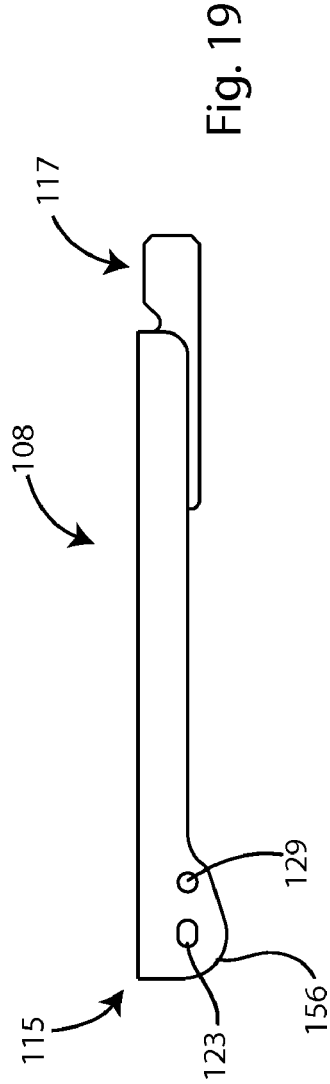
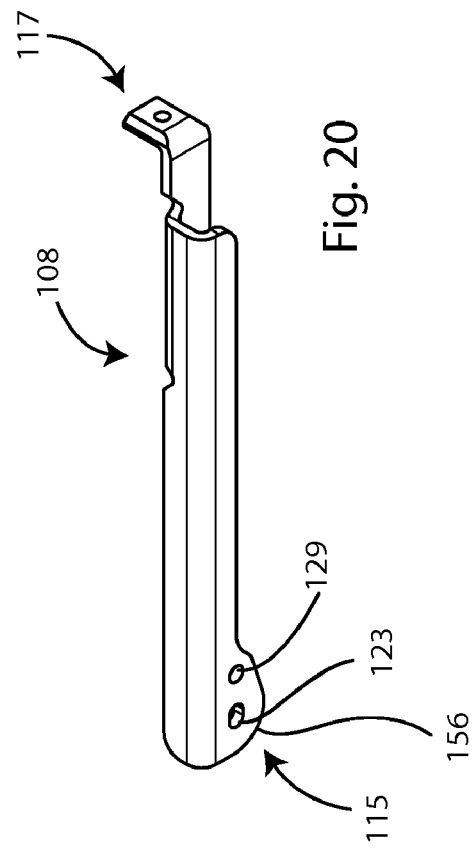

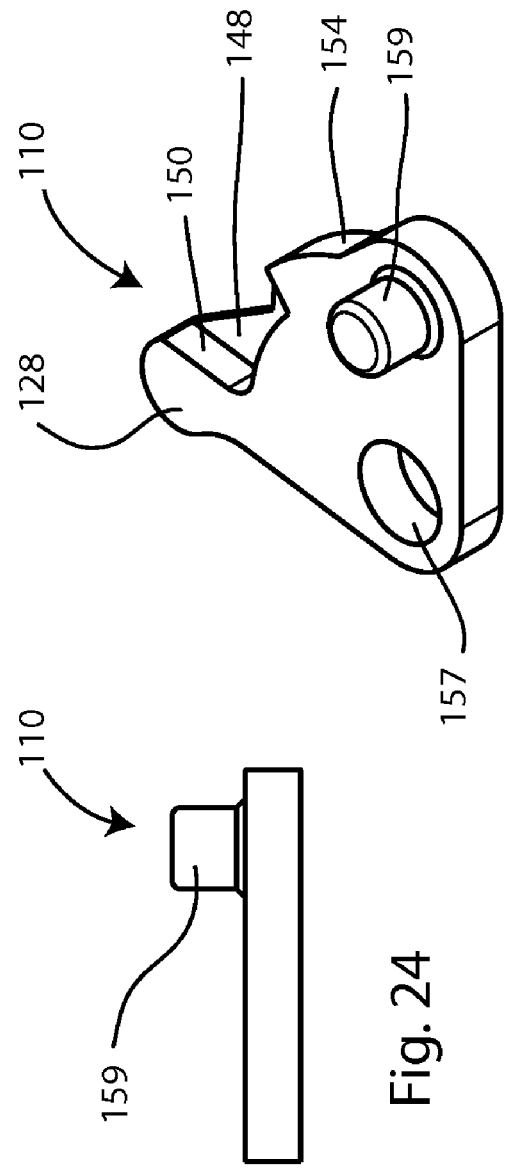

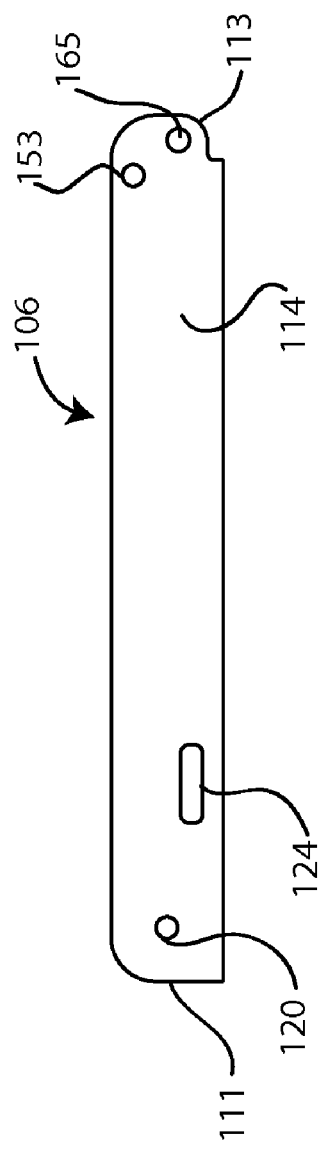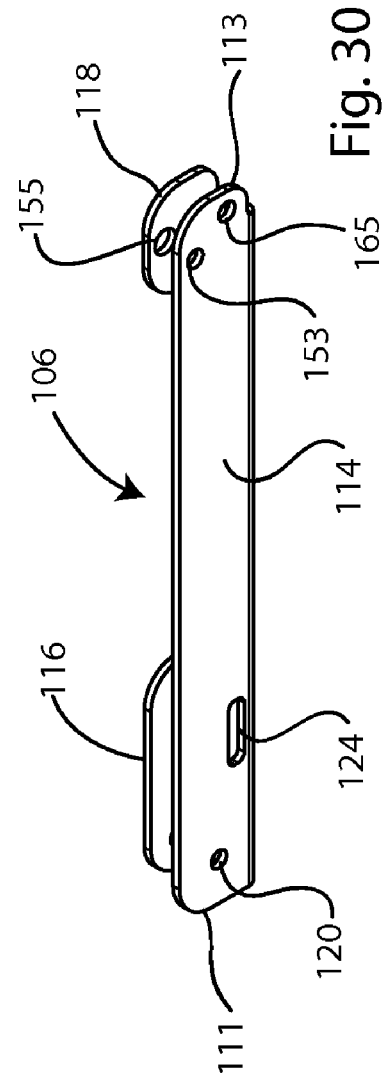

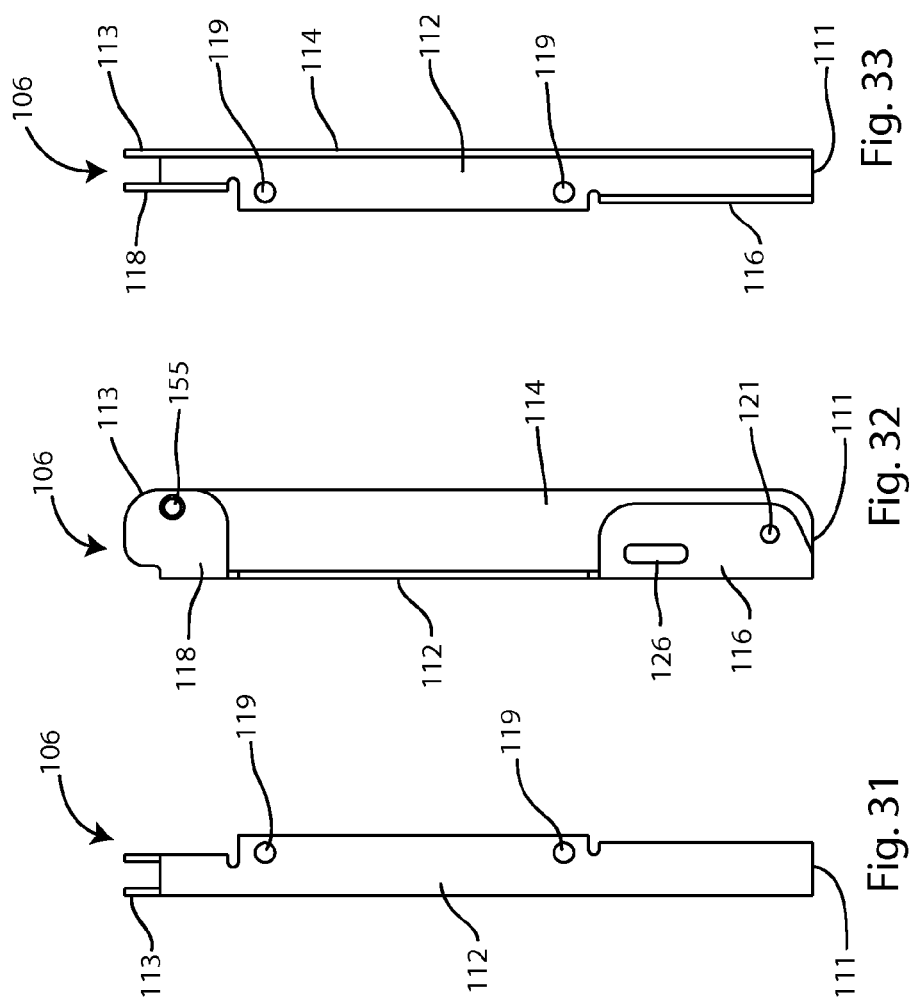

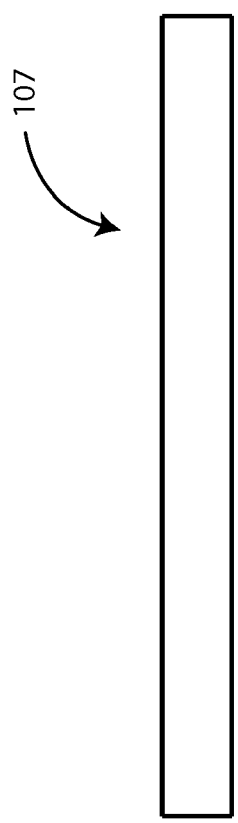
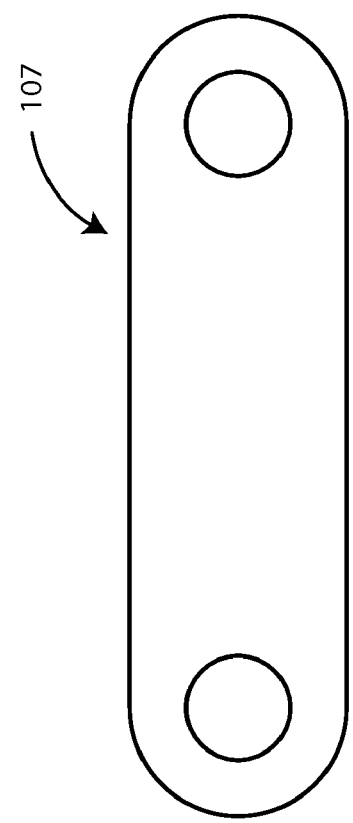

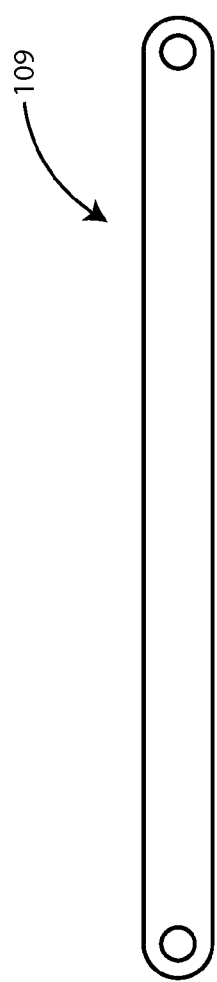

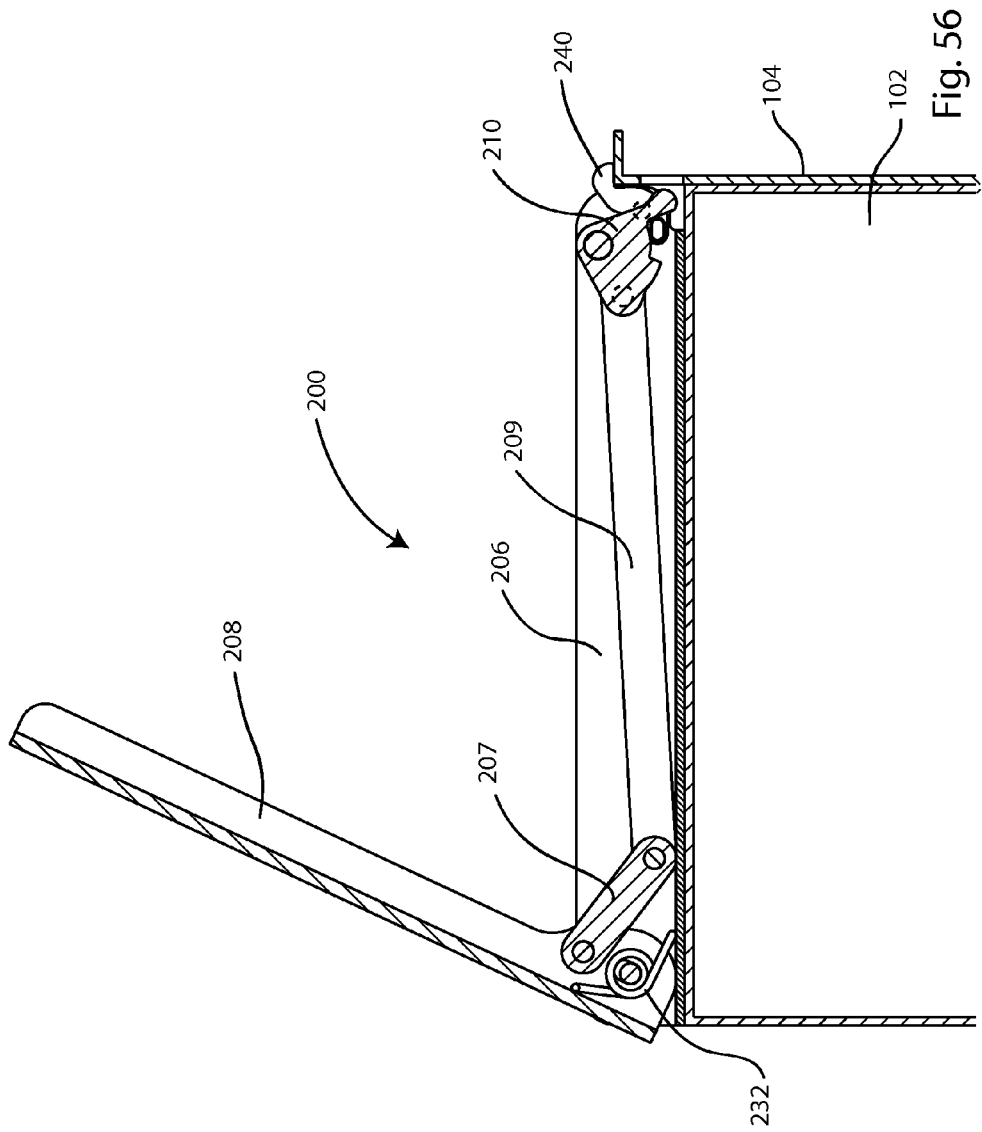

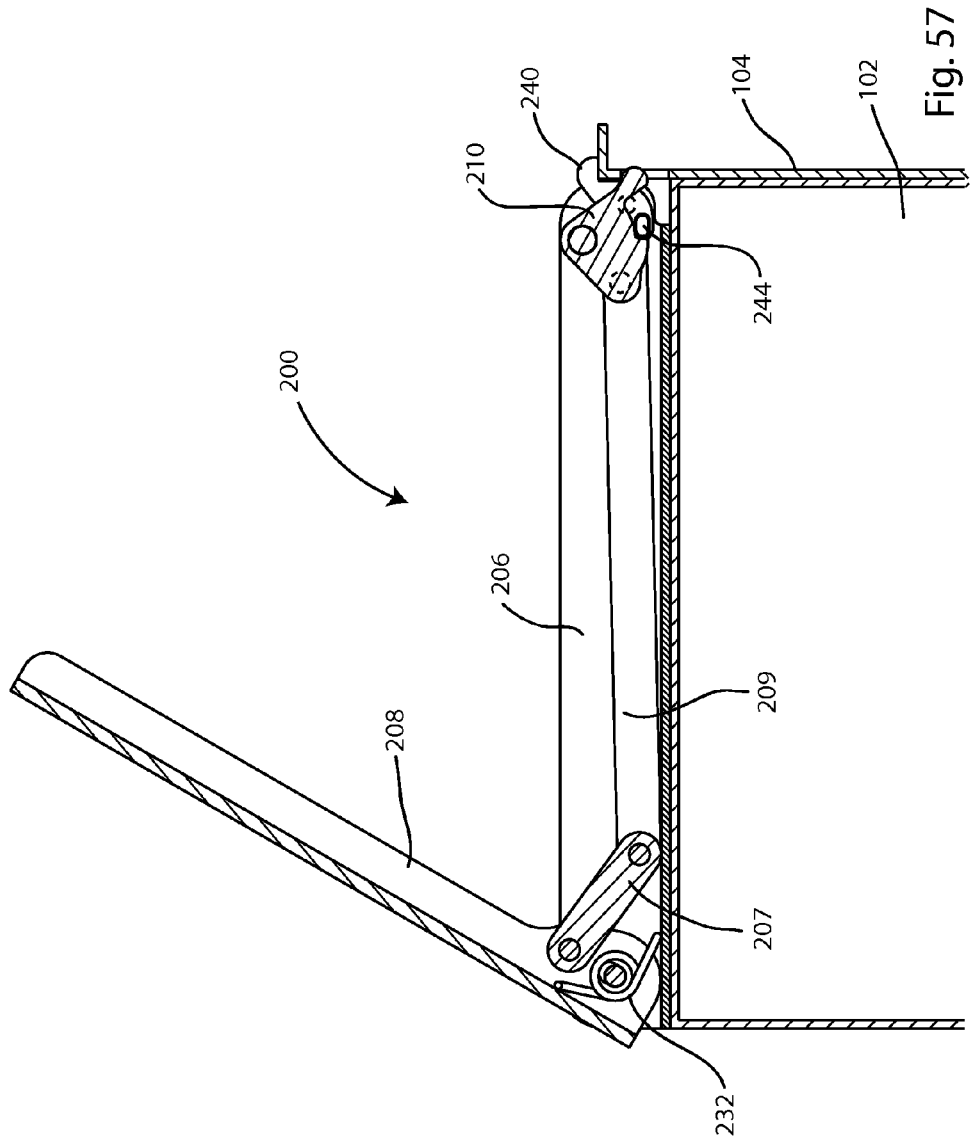

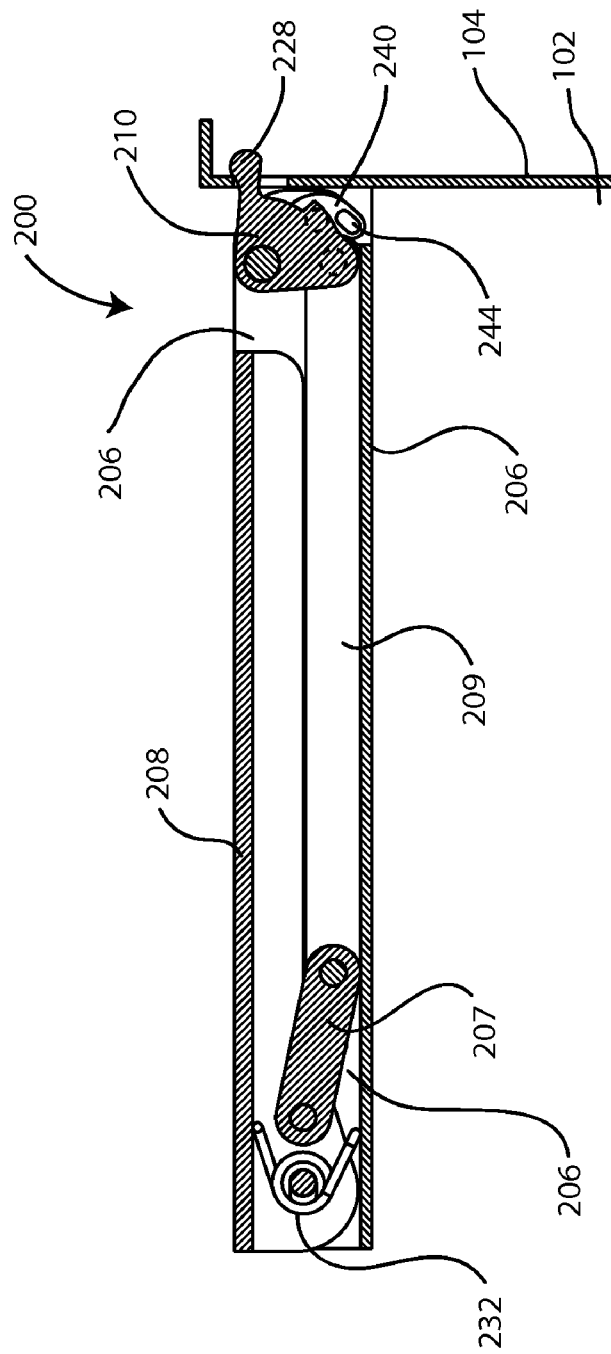

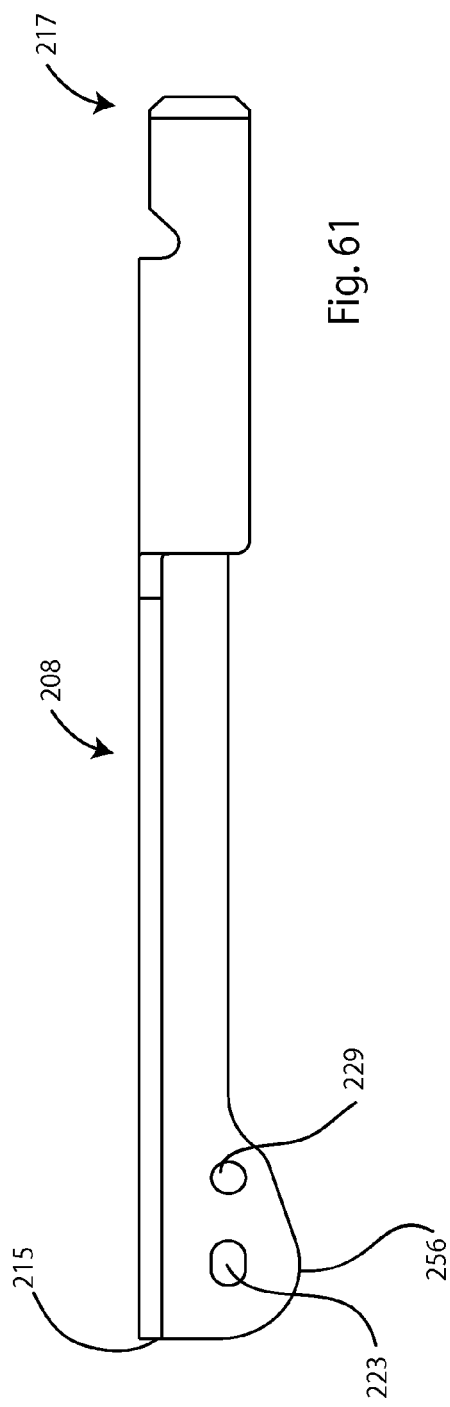
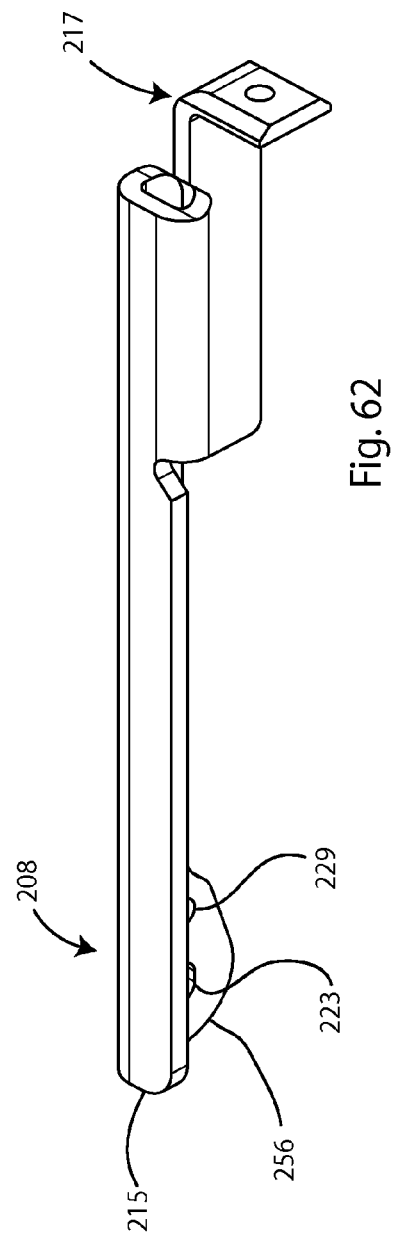

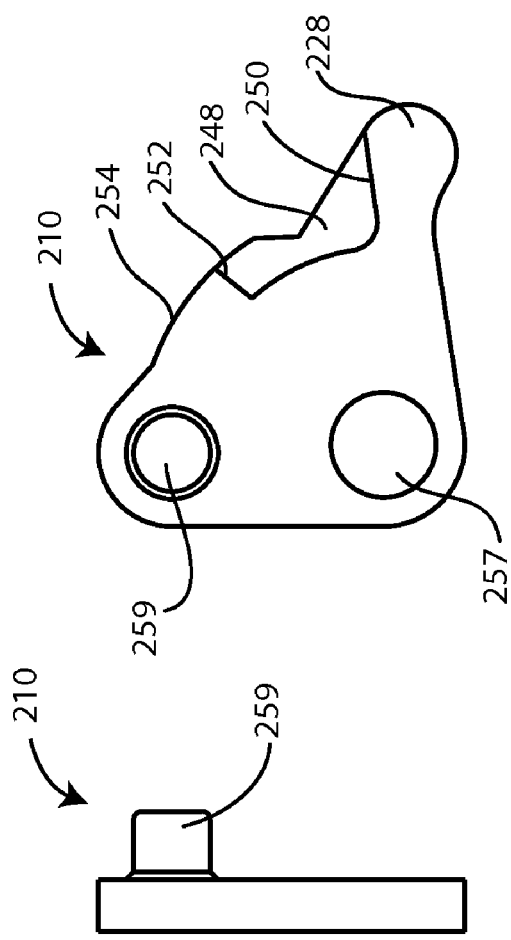
Fig. 70
Fig. 69
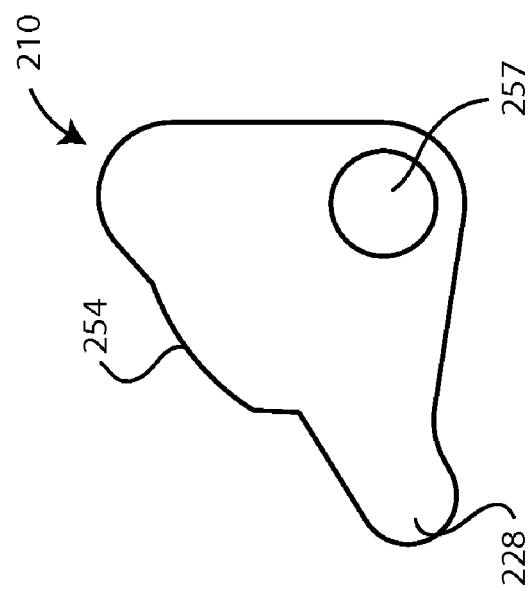
Fig. 68

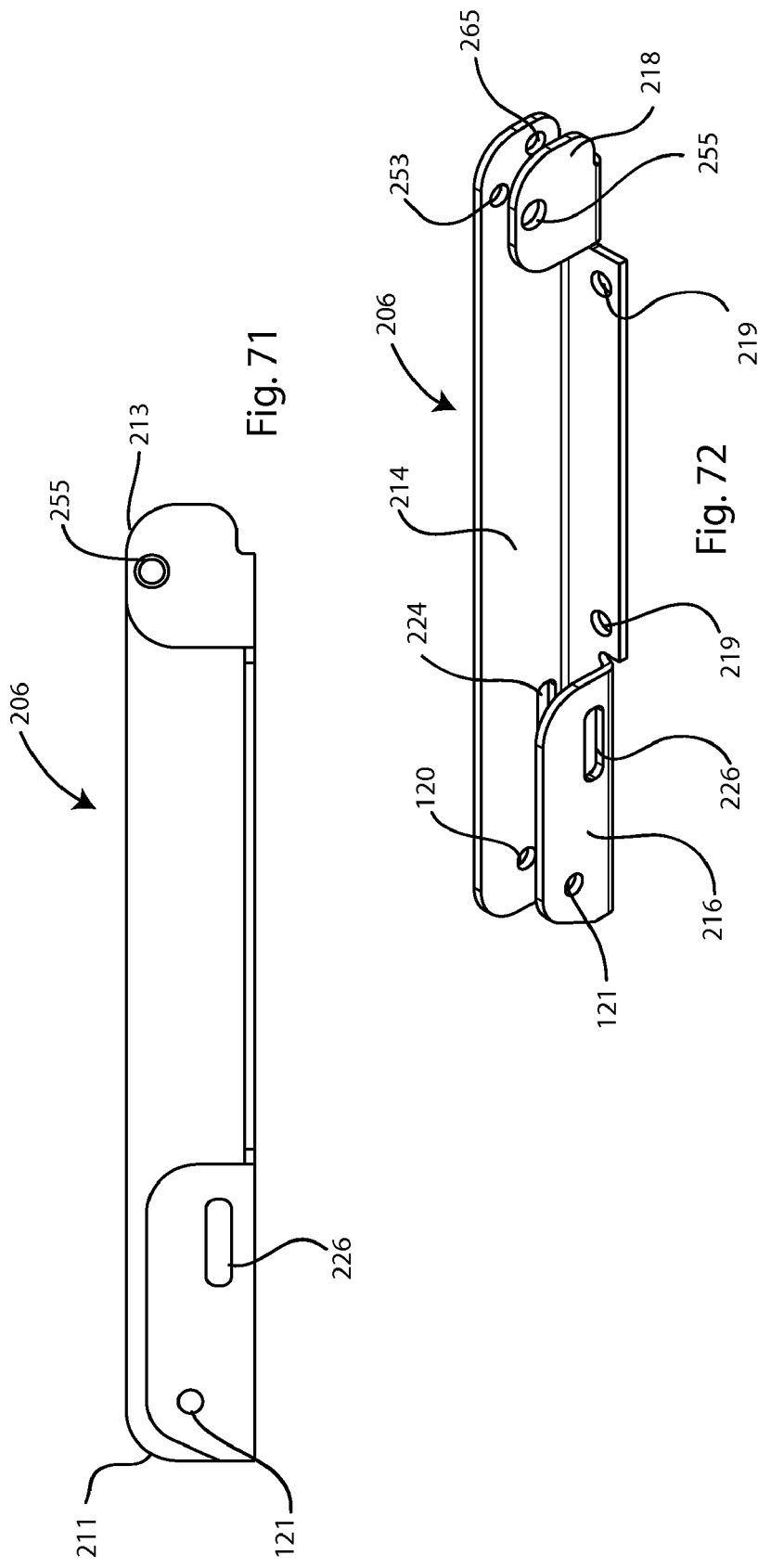

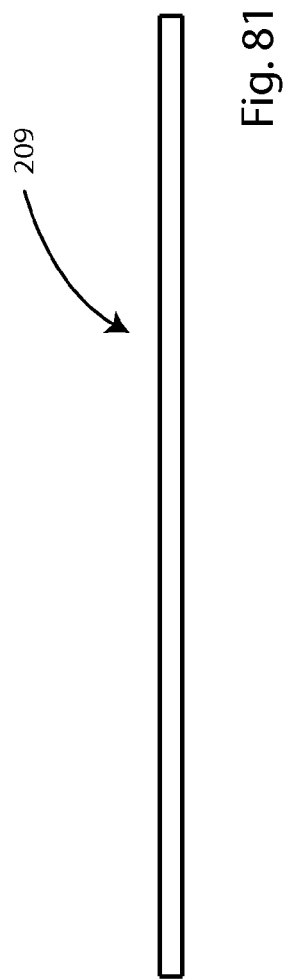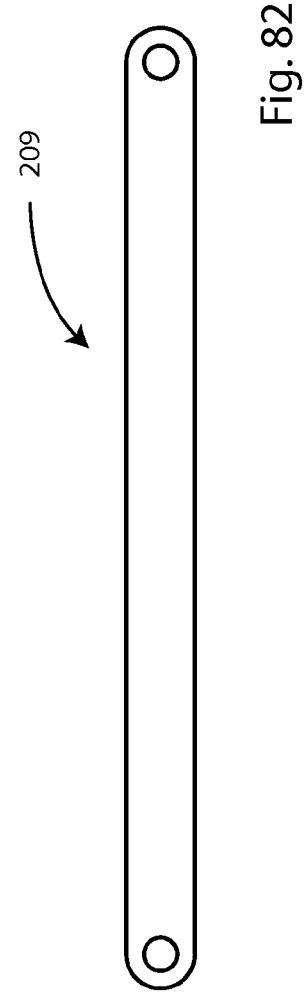

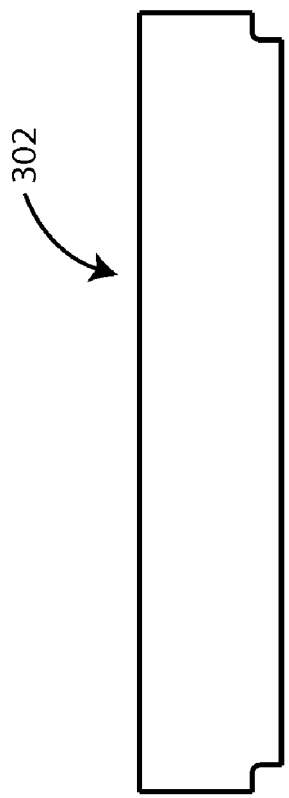
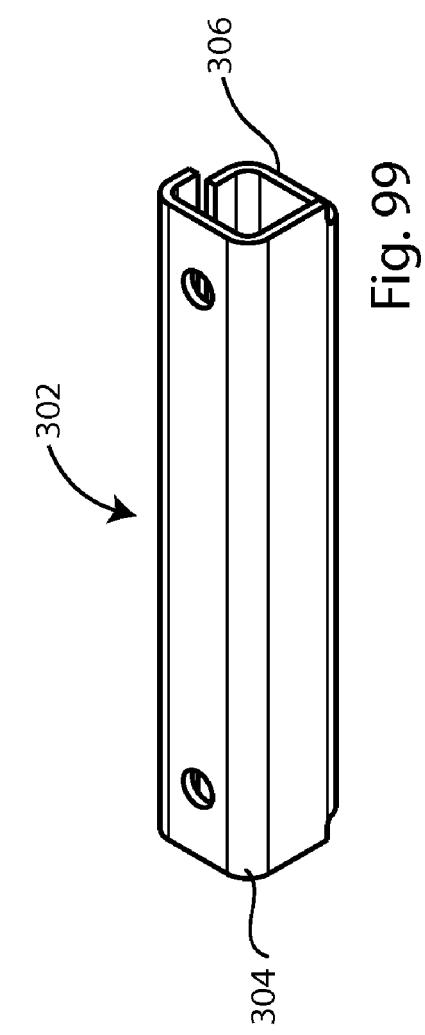

LEVERAGE DEVICE AND SYSTEM USING SAME

CROSS REFERENCE TO RELATED APPLICATIONS

This application claims the priority of U.S. provisional application for Pat. No. 61/036,921, filed on Mar. 14, 2008, which is incorporated by reference herein in its entirety.

BACKGROUND OF THE INVENTION

1. Field of the Invention

The present invention relates to a leverage device for leveraging a first member into a final position relative to a second member.

2. Description of the Prior Art

Leverage devices for leveraging a first member into a final position relative to a second member are known in the prior art. However, none are seen to teach or suggest the unique features of the present invention or to achieve the advantages of the present invention.

SUMMARY OF THE INVENTION

The present invention is directed to a leverage device for leveraging a first member from an initial position into a final position relative to a second member. The leverage device of the present invention includes at least a first actuating lever pivotally attached to at least a first corresponding mounting bracket. The mounting bracket is adapted for attachment to the first member. A cam is supported by the mounting bracket and is pivotally movable between a closed position and an open position in response to pivotal movement of the actuating lever. The cam can be brought into engagement with a portion of the second member or a keeper attached to the second member in order to releasably secure the first member in a final position relative to the second member. In the preferred embodiment, the leverage device is attached to a removable member, e.g. an electronic module, and the second member is part of a rack, shelf, or cabinet that provides for both the mechanical support of the electronic module and the electrical connection or interfacing of the electronic module to an electronic system usually including other electronic modules supported by the second member.

BRIEF DESCRIPTION OF THE DRAWINGS

FIGS. 11-12 are views of the secondary latch of the leverage system of the present invention.

FIGS. 19-23 are views of the actuating lever of the first leverage device of the present invention.

FIGS. 24-28 are views of the cam of the first leverage device of the present invention.

FIGS. 29-33 are views of the mounting bracket of the first leverage device of the present invention.

FIGS. 34-37 are views of the first linkage member of the first leverage device of the present invention.

FIGS. 38-40 are views of the second linkage member of the first leverage device of the present invention.

FIGS. 56-60 are environmental, cross-sectional views of the second leverage device of the leverage system of the present invention in various stages of operation.

FIGS. 61-65 are views of the actuating lever of the second leverage device of the present invention.

FIGS. 66-70 are views of the cam of the second leverage device of the present invention.

FIGS. 71-75 are views of the mounting bracket of the second leverage device of the present invention.

FIGS. 80-82 are views of the second linkage member of the second leverage device of the present invention.

FIGS. 98-103 are views of the handle of the leverage system of the present invention.

Similar reference characters denote corresponding features consistently throughout the attached drawings.

DETAILED DESCRIPTION OF THE PREFERRED EMBODIMENTS

Figure 1:
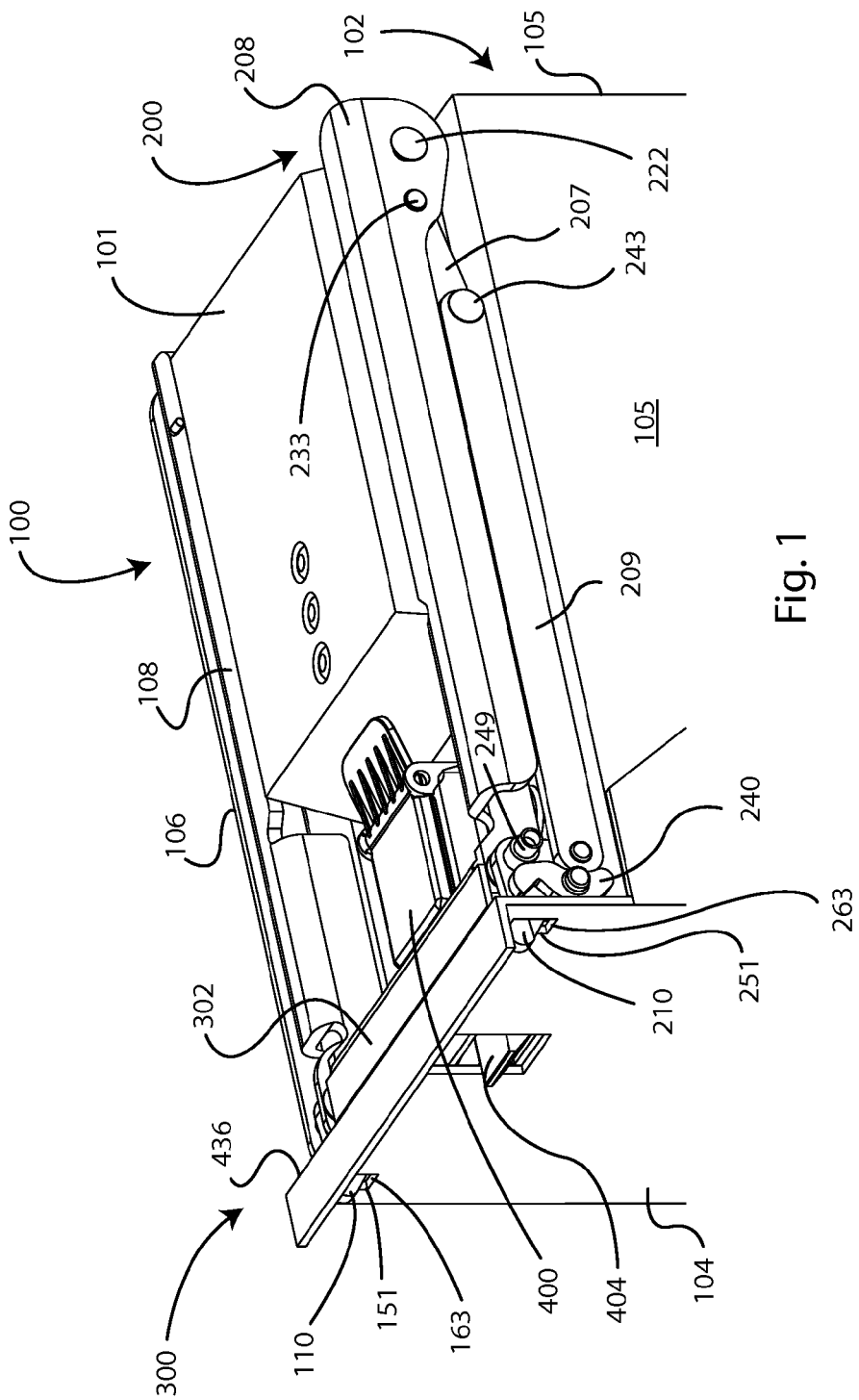
FIG. 1 is a fragmentary environmental view of the leverage system of the present invention.
Figure 2:
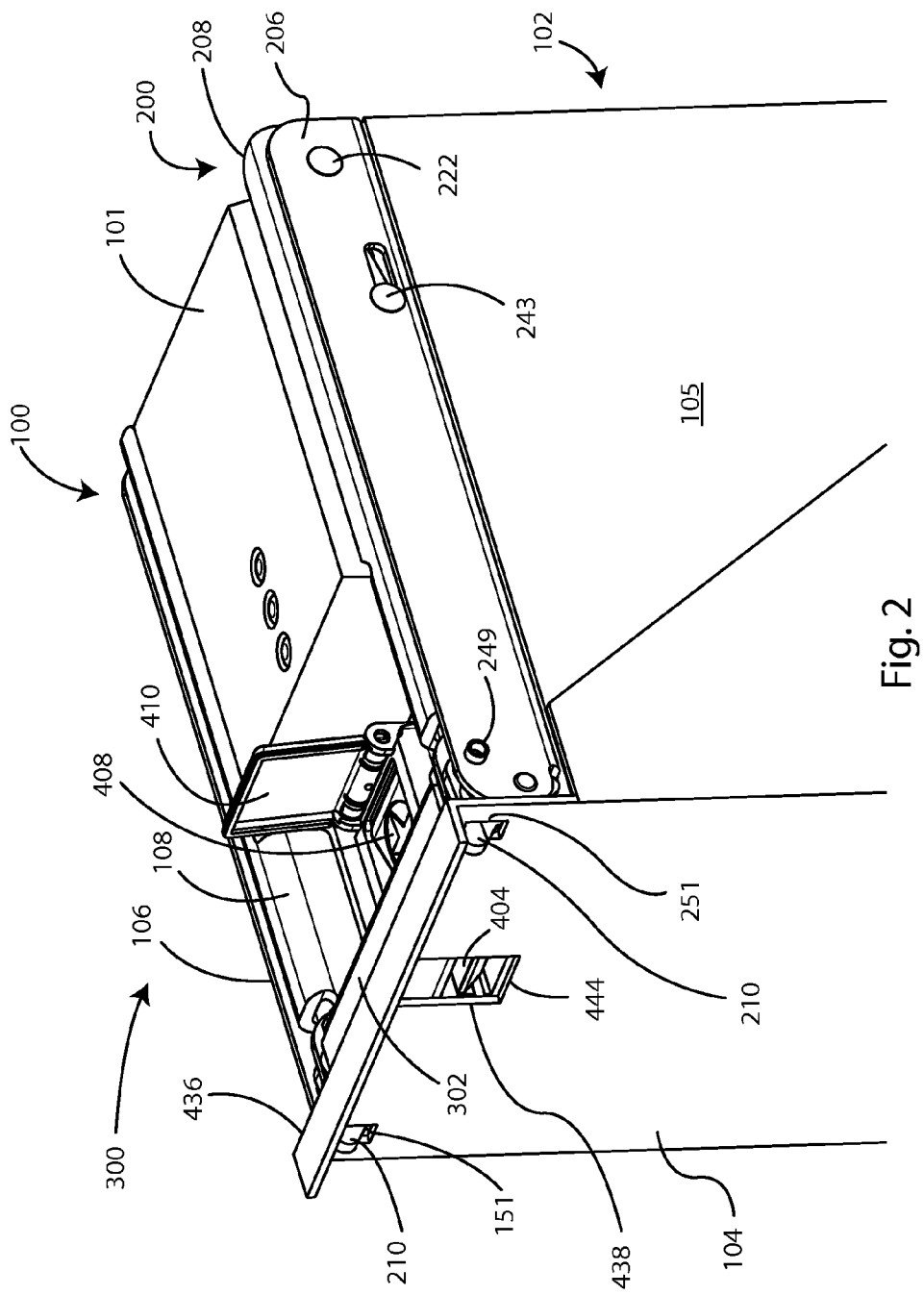
FIGS. 2-4 are environmental views of the leverage system of the present invention in various stages of operation.
Figure 3:
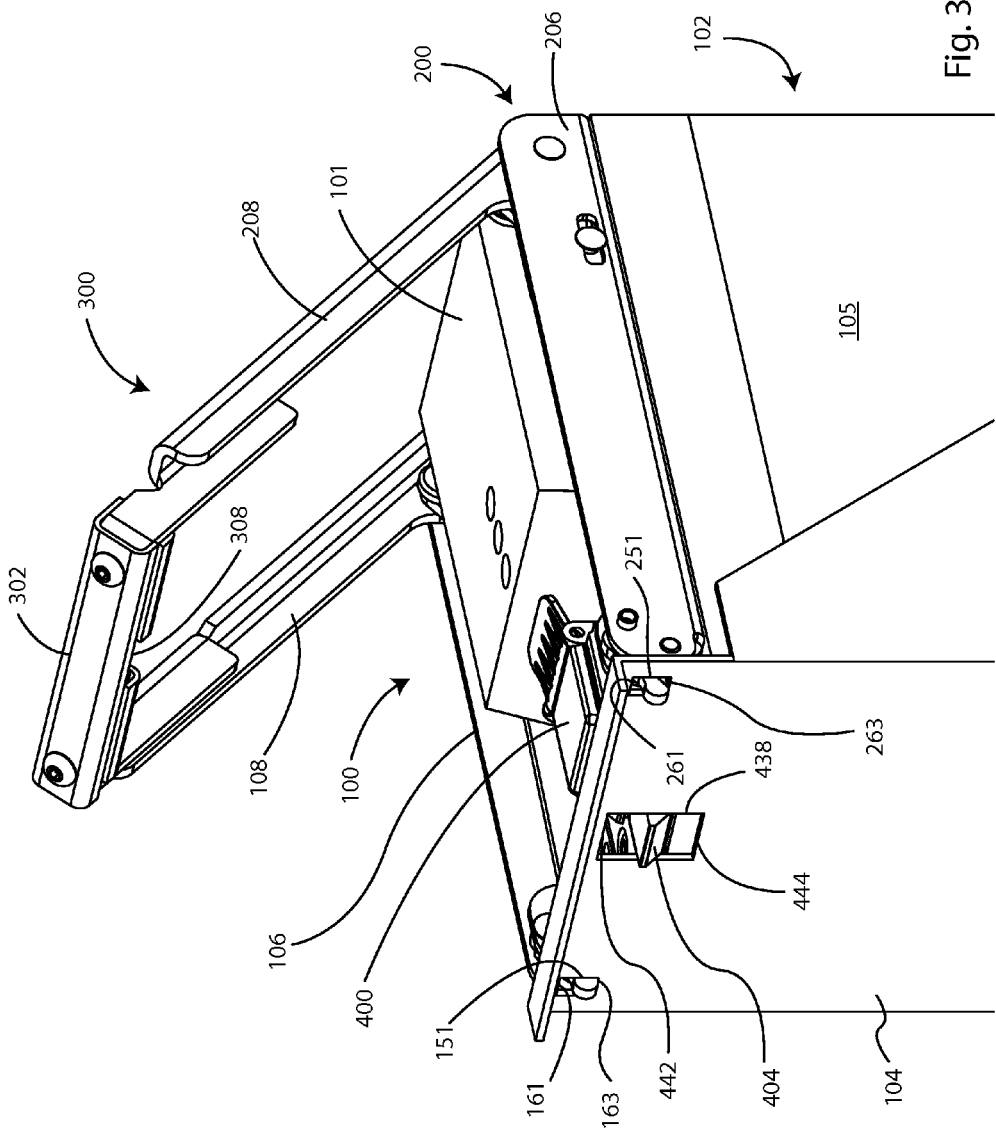
Figure 4:
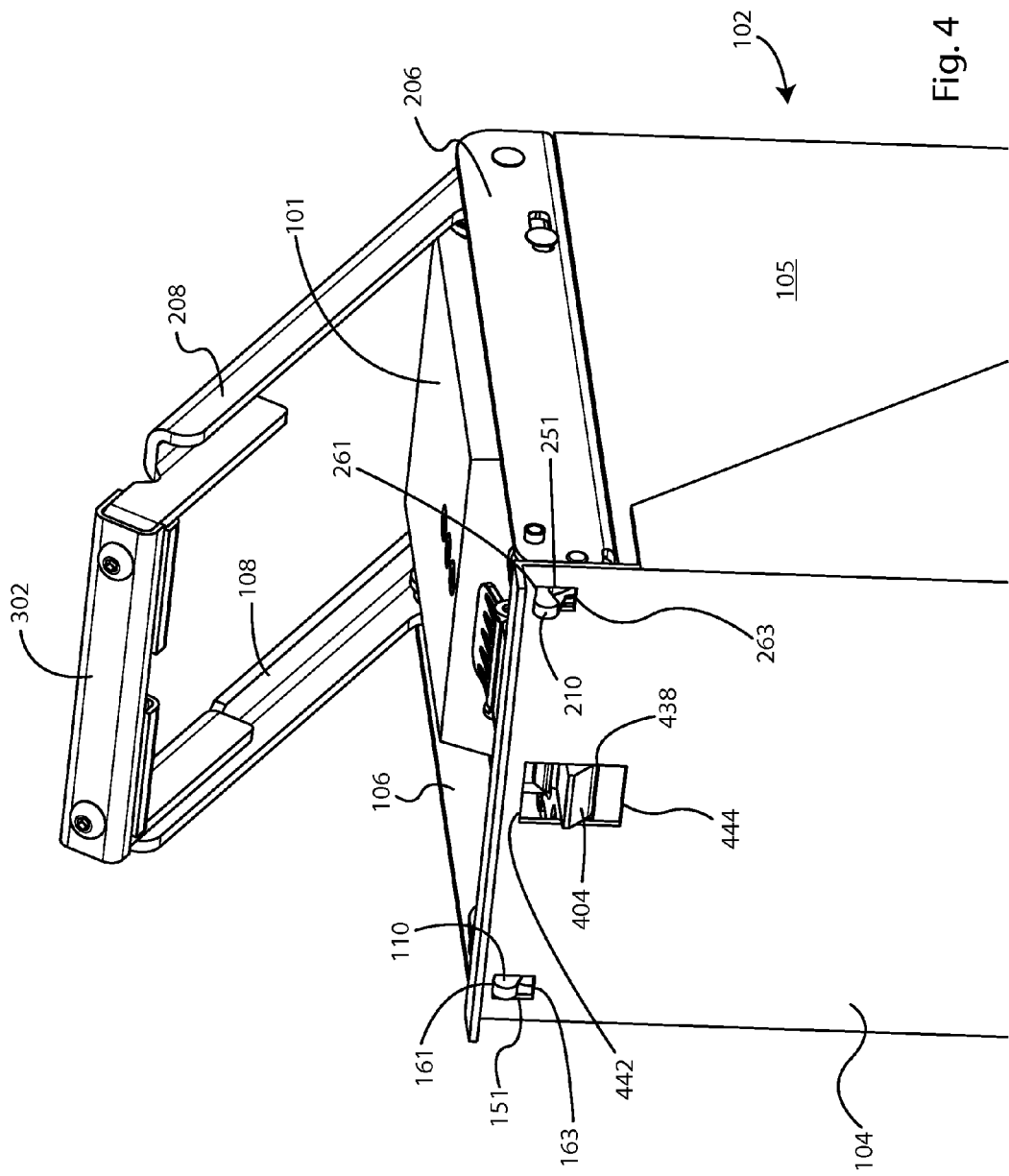
Figure 5:
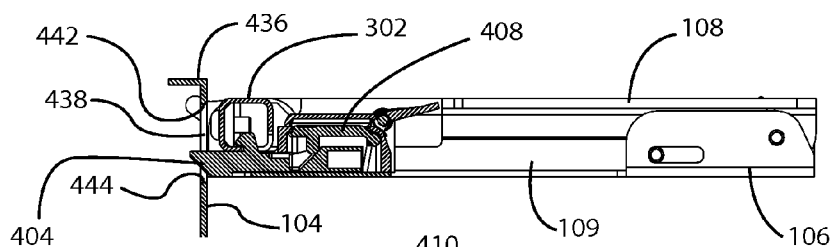
FIGS. 5-9 are environmental, cross-sectional views of the leverage system of the present invention in various stages of operation.
Figure 6:
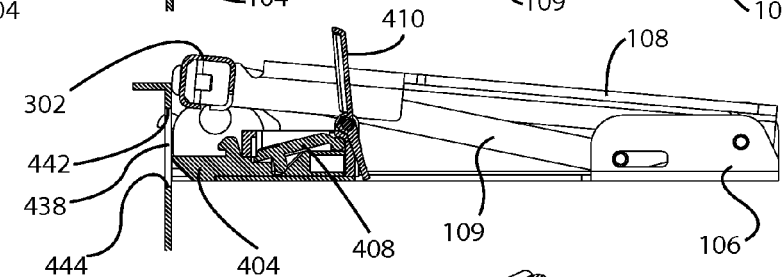
Figure 55:
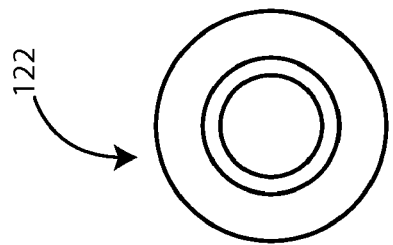
Figure 54:
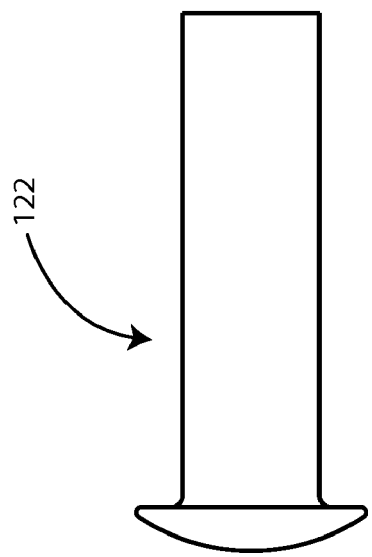
Figure 53:
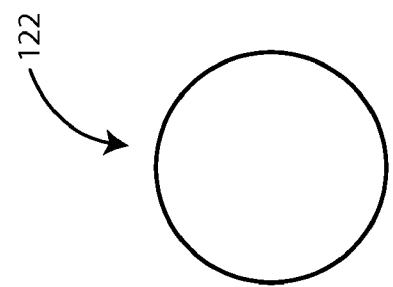
Figure 58:
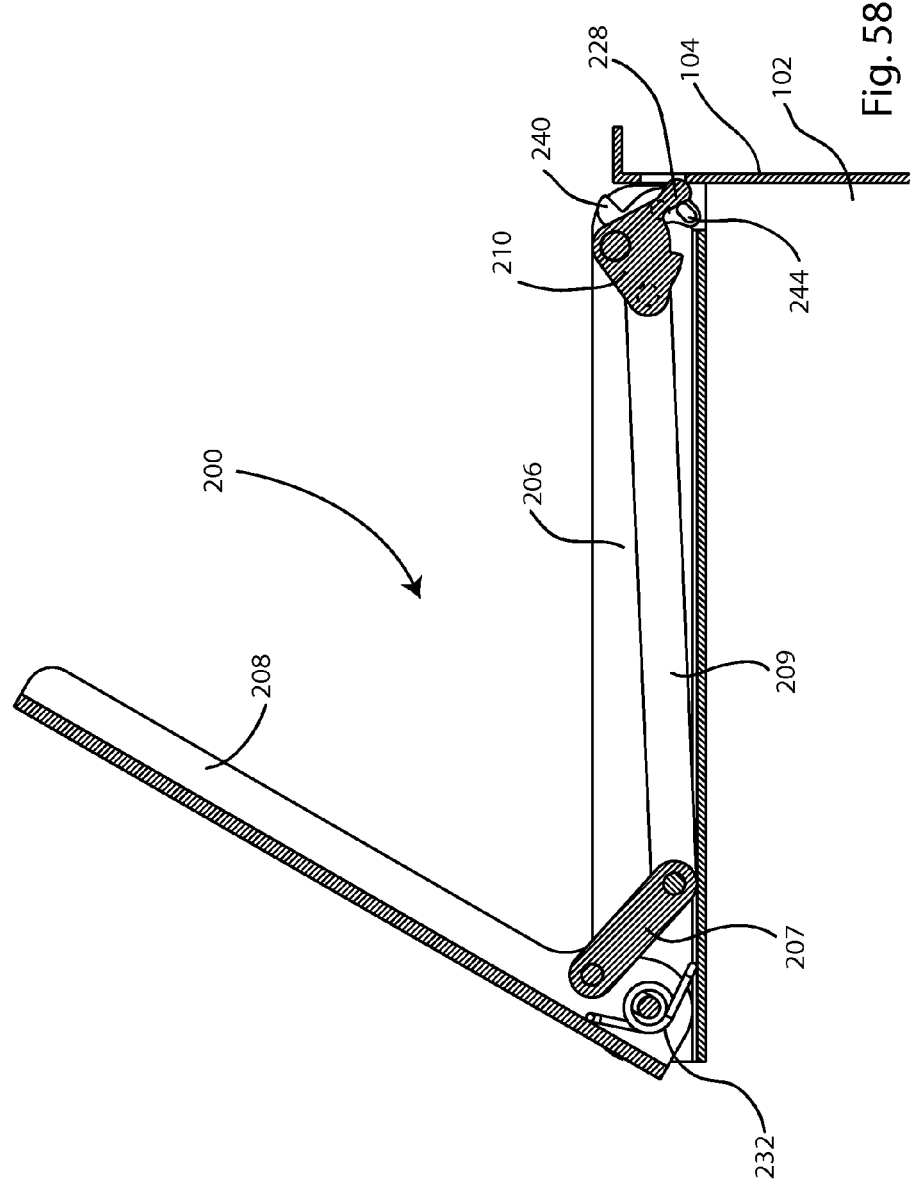
Figure 59:
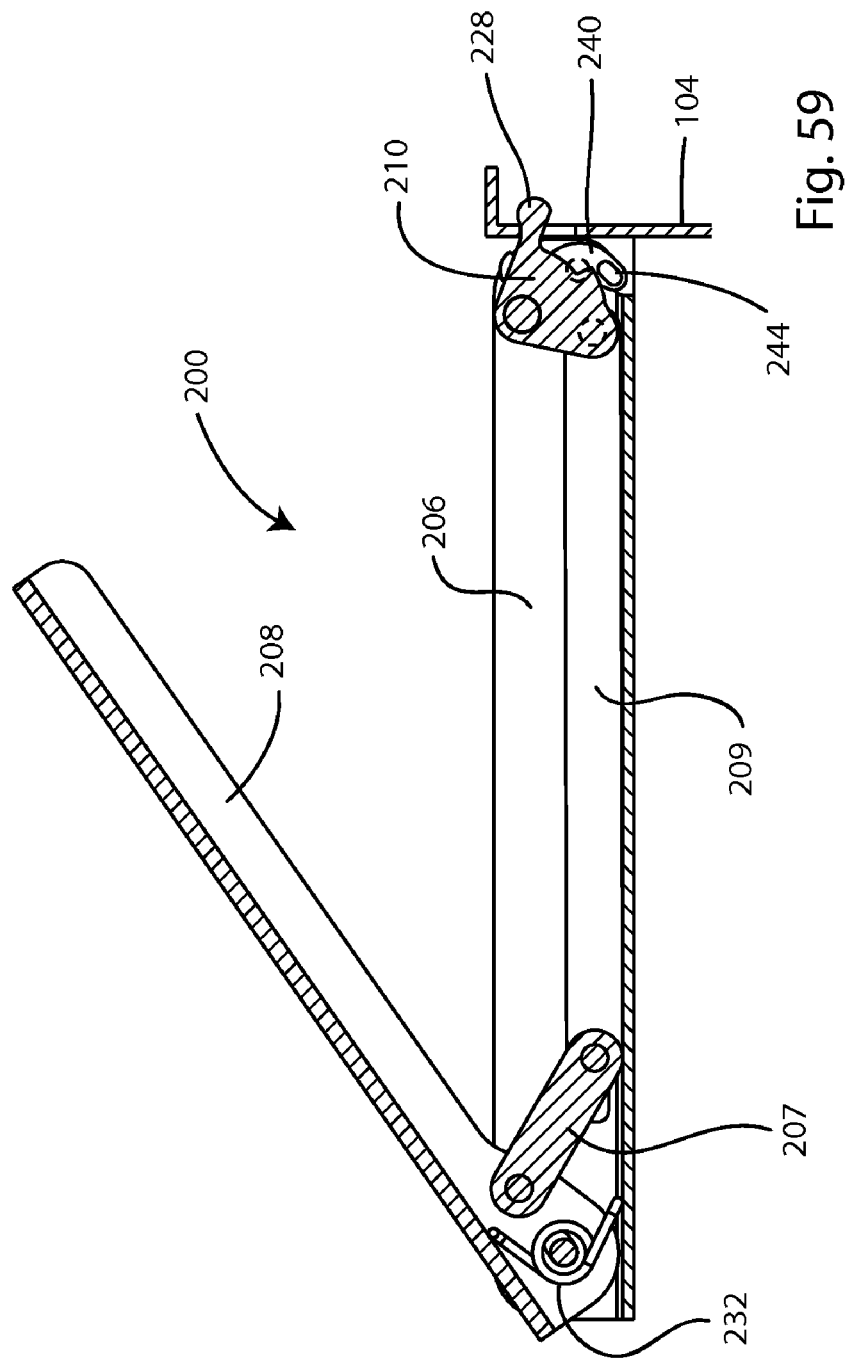
Figure 65:
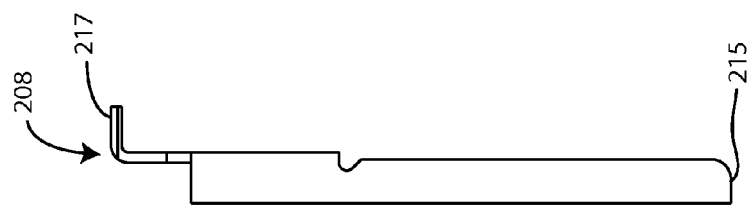
Figure 64:
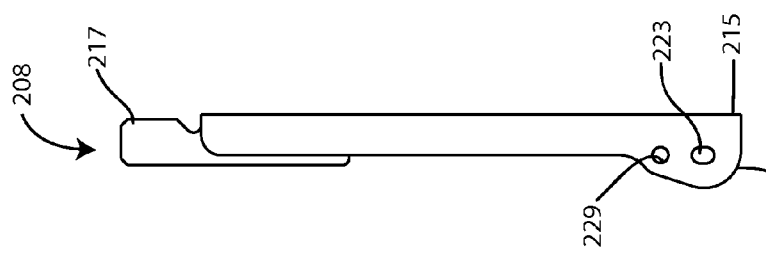
Figure 63:
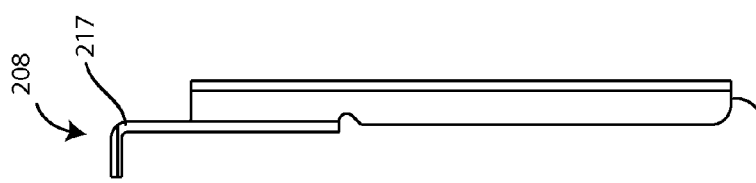
Figure 67:
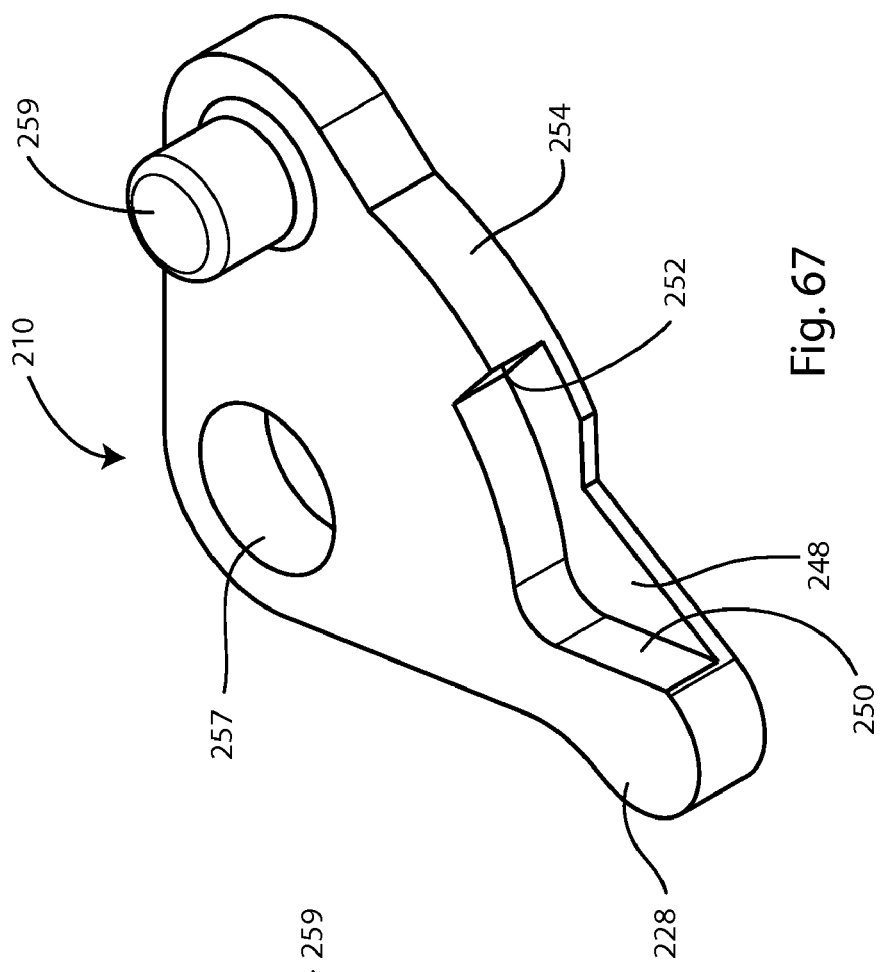
Figure 66:
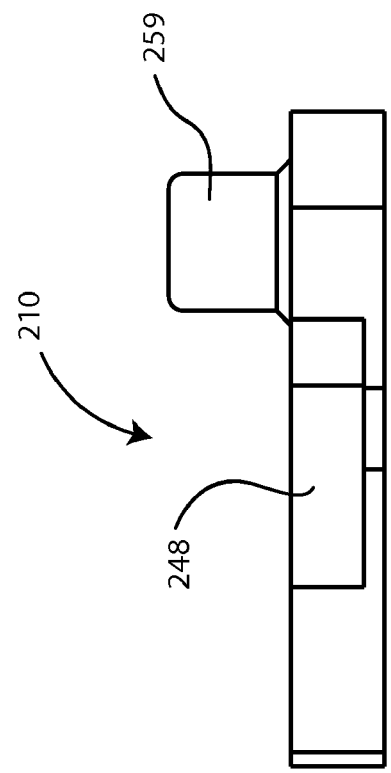
Figure 75:
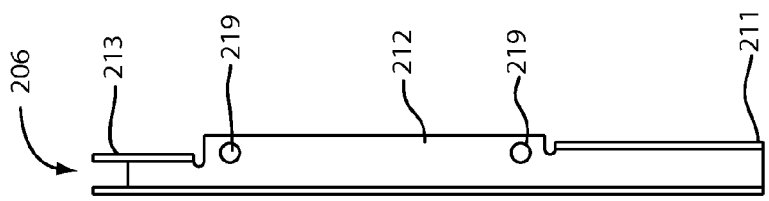
Figure 74:
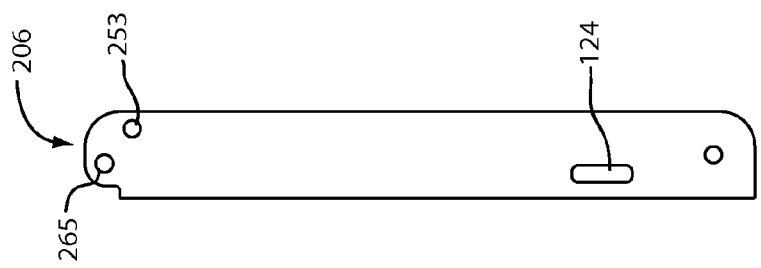
Figure 73:
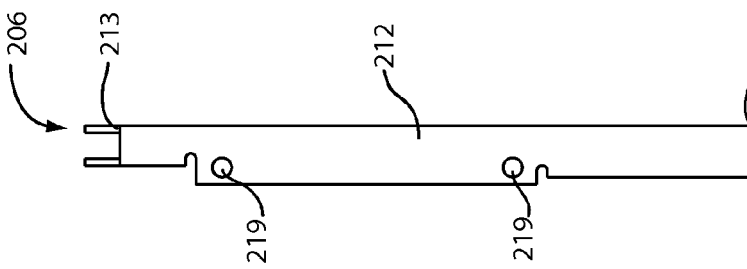
Figure 77:
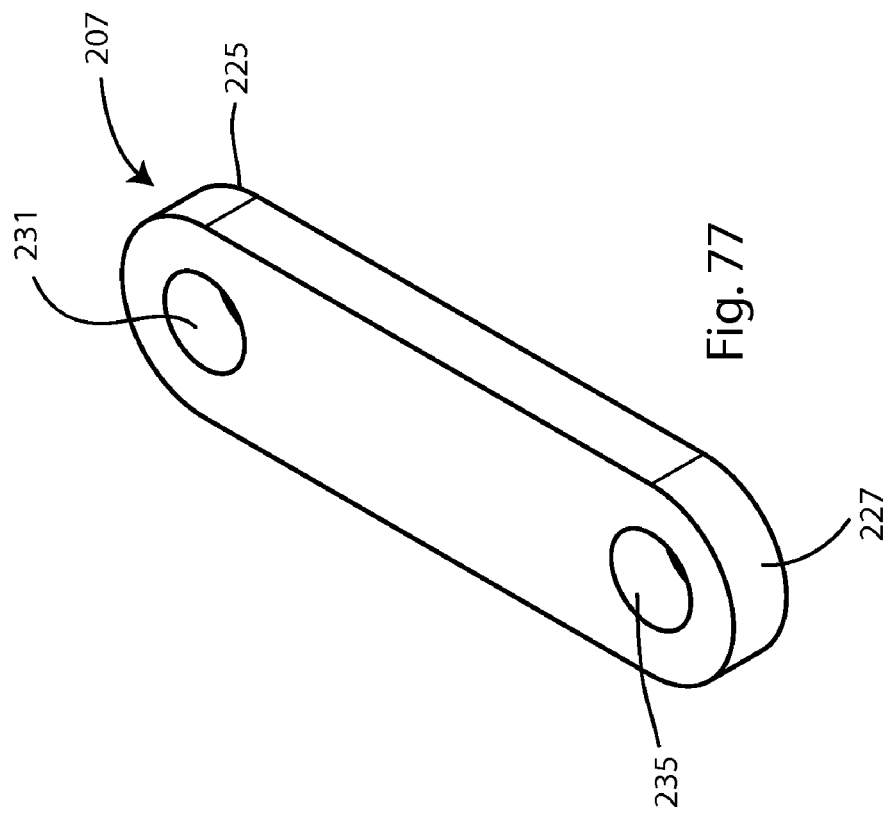
FIGS. 76-79 are views of the first linkage member of the second leverage device of the present invention.
Figure 76:
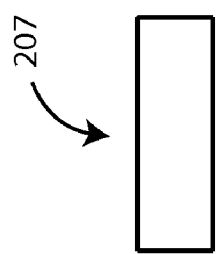
Figure 78:
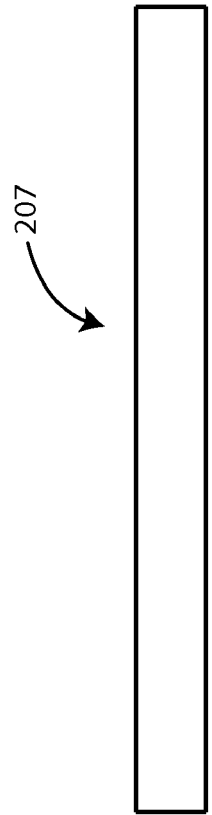
Figure 79:
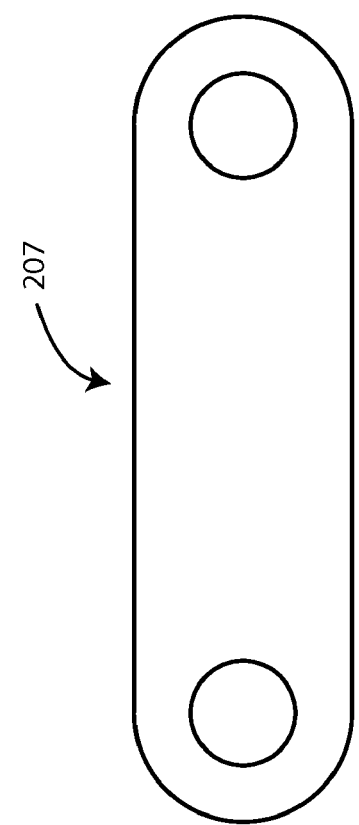

Referring to FIGS. 1-55, the present invention is directed to a leverage device 100 for leveraging a first member from an initial position into a final position relative to a second member. The leverage device 100 of the present invention releasably secures the first member, such as an electronic module 102, to a second member, such as a shelf 104 (only a portion of the shelf is shown). The electronic module 102 is diagrammatically illustrated as a rectangular box in the attached drawings. The electronic module 102 has a front surface 101, a rear surface 103, and side surfaces 105. The leverage device 100 mounts to the front surface 101 of the electronic module 102. The rear surface 103, or maybe the sides 105, of the electronic module 102 is provided with one or more electrical connectors (not shown) that interface with mating electrical connectors (not shown) in the shelf 104 to electrically connect the electronic module to the rest of the electronic system (not shown). The leverage device 100 of the present invention at least includes a mounting bracket 106, an actuating lever 108, a first linkage member 107, a second linkage member 109, and a cam 110.

The mounting bracket 106 is best illustrated in FIGS. 29-33. The mounting bracket 106 is elongated and has a first end portion 111, a second end portion 113. In the illustrated example, the mounting bracket 106 includes a base plate 112, and at least one side plate 114 extending perpendicularly from the base plate 112. In the illustrated example, the mounting bracket 106 further includes a second side plate 116 and a third side plate 118, in addition to the first side plate 114. The base plate 112 has holes 119 that allow the mounting bracket 106 to be mounted to the front surface 101 of the electronic module 102 using appropriate fasteners such as screws, rivets or the like. The base plate 112 of the mounting bracket 106 abuts the front surface 101 of the electronic module 102 once the mounting bracket 106 is installed to the electronic module 102. The actuating lever 108 is best illustrated in FIGS. 19-23. The actuating lever 108 has a first end portion 115 and a second end portion 117. The first end portion of the actuating lever 108 is pivotally connected to the first end portion of the mounting bracket 106 to thereby pivotally attach the actuating lever 108 to the mounting bracket 106. At least a portion of the second side plate 116 is located at the first end portion of the mounting bracket 106 in facing relationship to the first side plate 114. The side plate 114 of the mounting bracket 106 has a hole 120 located in the first end portion of the mounting bracket 106. The side plate 116 has a hole 121 that is in registry with the hole 120 of the side plate 114 of the mounting bracket 106. The actuating lever 108 has at least one hole 123 in its first end portion 115. The pivot pin 122 extends through the holes 120, 121, and 123 to pivotally attach the actuating lever 108 to the mounting bracket 106.

The first linkage member 107 is best illustrated in FIGS. 34-37. The first linkage member 107 has a first end portion 125 and a second end portion 127. The first linkage member 107 is pivotally connected to the actuating lever 108. The first end portion of the first linkage member 107 is pivotally connected to the actuating lever 108 at a location spaced apart from the axis of rotation of the pivotal attachment between the actuating lever 108 and the mounting bracket 106 as defined by the pivot pin 122. In the illustrated example, the pivotal attachment between the actuating lever 108 and the first linkage member 107 is located intermediate the second end portion of the actuating lever 108 and the pivotal attachment between the actuating lever 108 and the mounting bracket 106, with the pivotal attachment between the actuating lever 108 and the first linkage member 107 being located closer to the pivotal attachment between the actuating lever 108 and the mounting bracket 106 than to the second end portion of the actuating lever 108. In the illustrated example, the pivotal attachment between the actuating lever 108 and the first linkage member 107 is located intermediate the middle 147 of the actuating lever 108 and the pivotal attachment between the actuating lever 108 and the mounting bracket 106, with the pivotal attachment between the actuating lever 108 and the first linkage member 107 being located closer to the pivotal attachment between the actuating lever 108 and the mounting bracket 106 than to the middle 147 of the actuating lever 108. The actuating lever 108 has at least one hole 129 at a location corresponding to the pivotal attachment between the actuating lever 108 and the first linkage member 107. The first linkage member 107 has at least one hole 131 in its first end portion that is in registry with the hole 129 of the actuating lever 108. The pivot pin 133 extends through the holes 129 and 131 to pivotally attach the first linkage member 107 to the actuating lever 108. The middle of a member as used herein is the midline of the member with respect to its length, and the midline is the perpendicular bisector of the length of the member.

Figure 38:
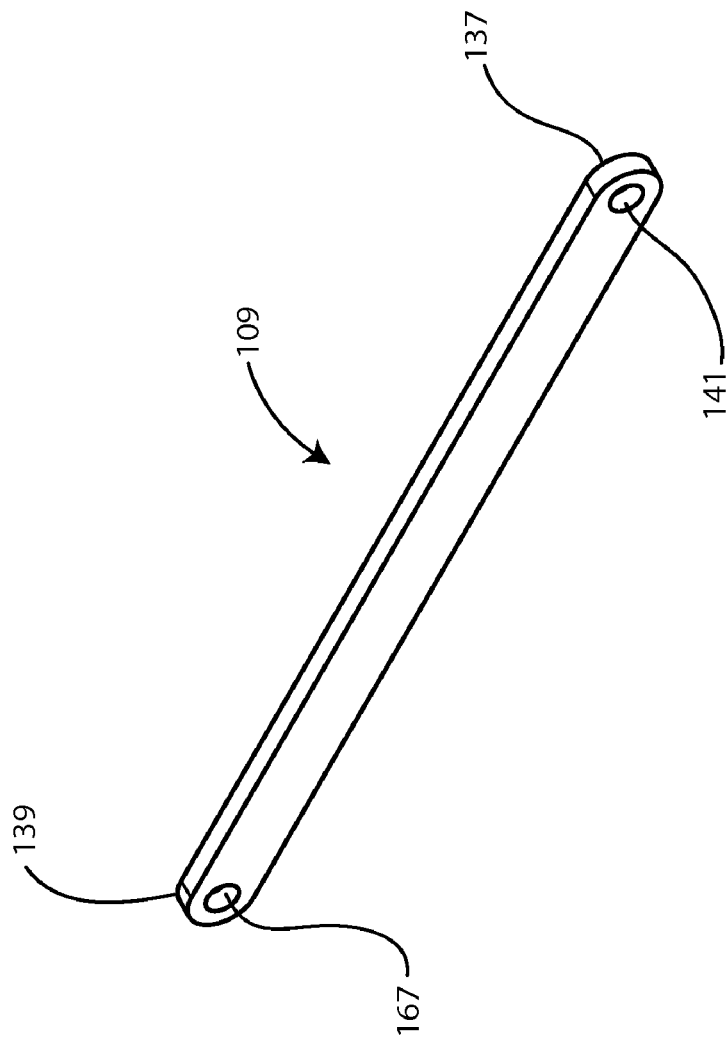
Figure 41:
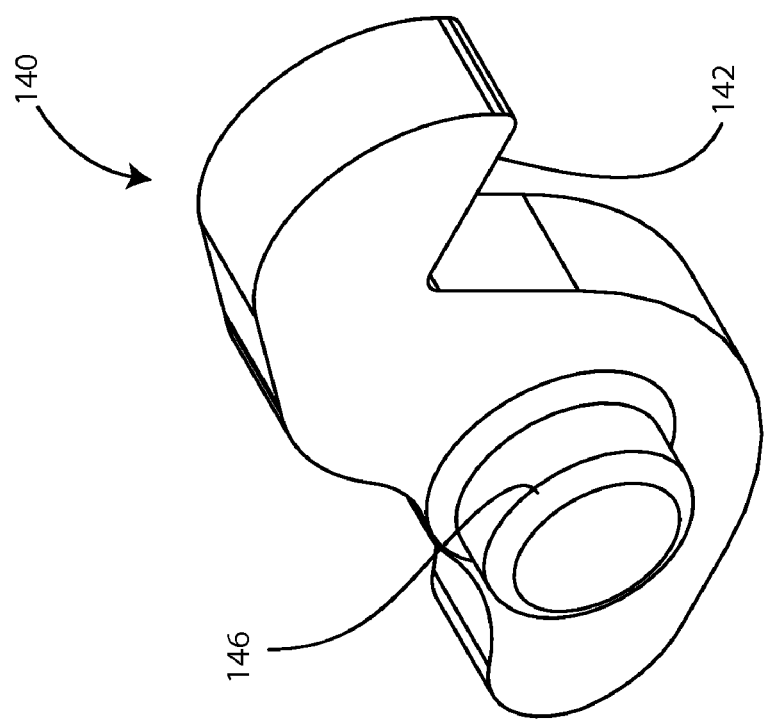
FIGS. 41-42 are views of the stop hook of the first leverage device of the present invention.
Figure 42:
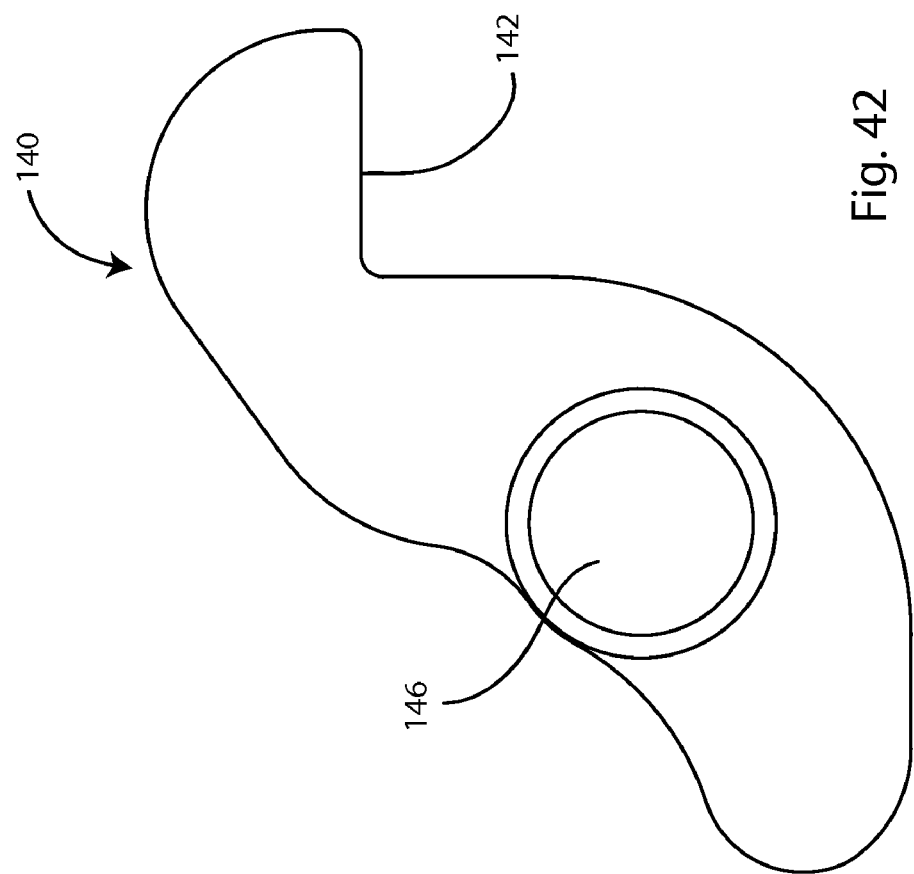
Figure 43:
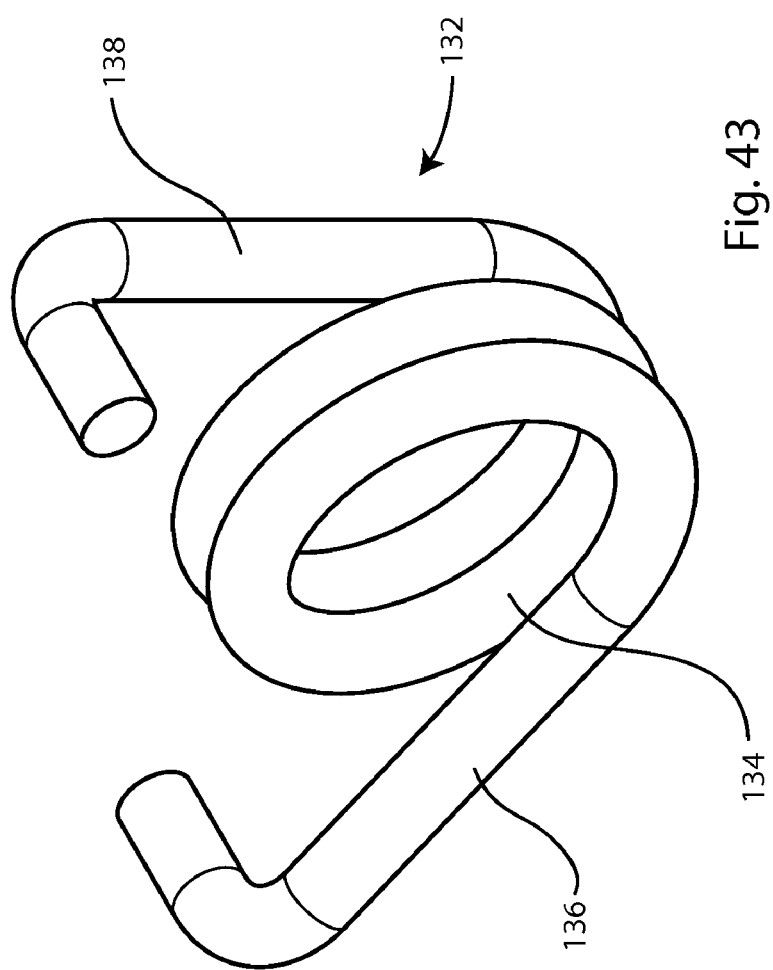
FIG. 43 is an isometric view of the torsion spring of the first leverage device of the present invention.
Figure 45:
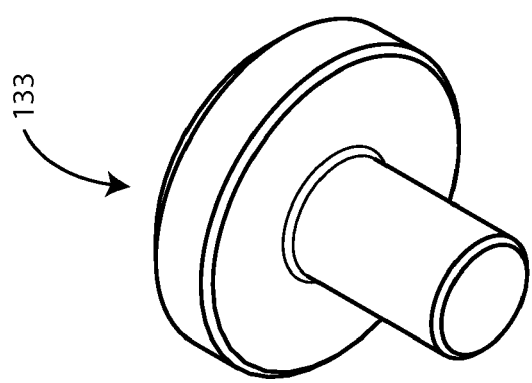
FIGS. 44-47 are views of the pivot pin connecting the actuating lever to the first linkage member of the first leverage device of the present invention.
Figure 44:
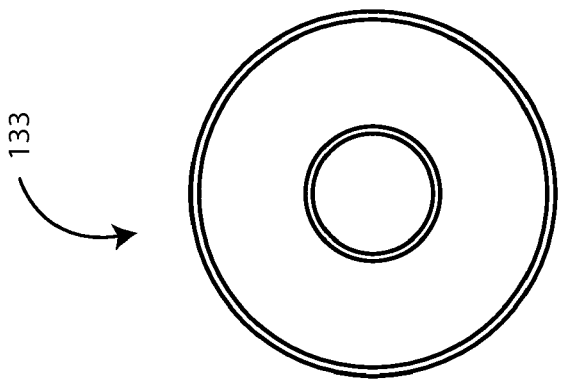
Figure 47:
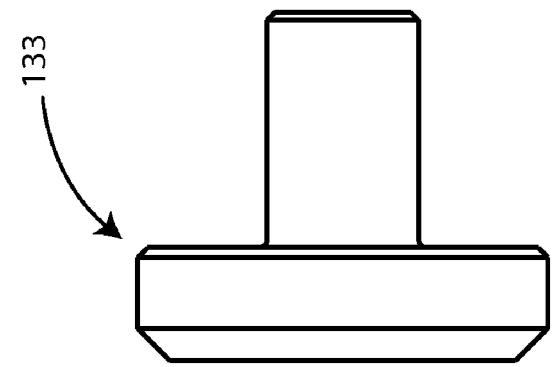
Figure 46:
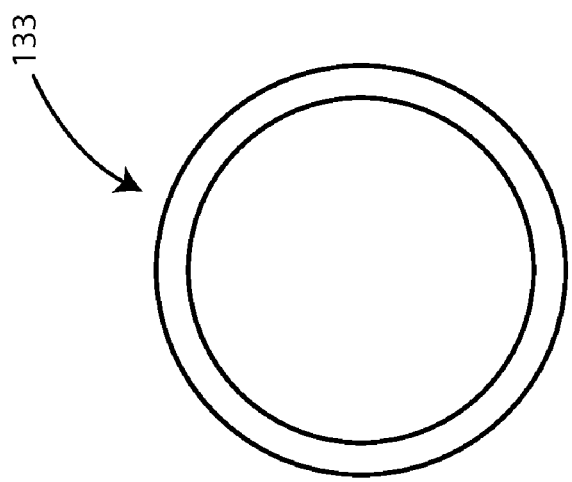
Figure 49:
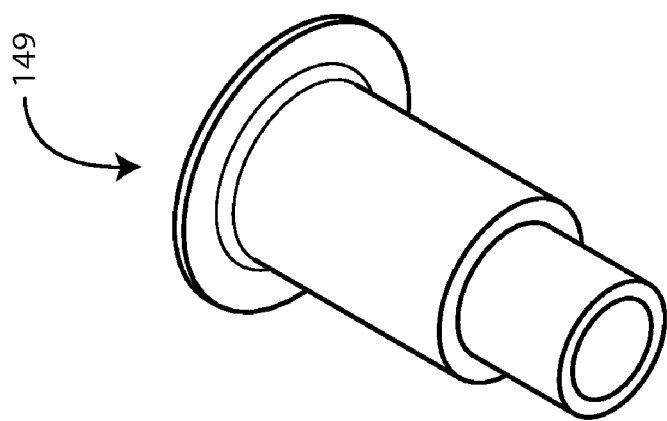
FIGS. 48-51 are views of the pivot pin connecting the cam to the mounting bracket of the first leverage device of the present invention.
Figure 48:
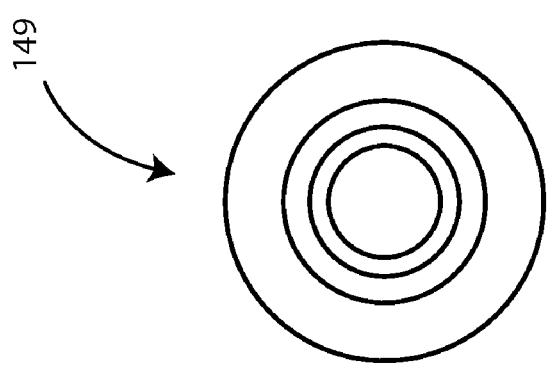
Figure 51:
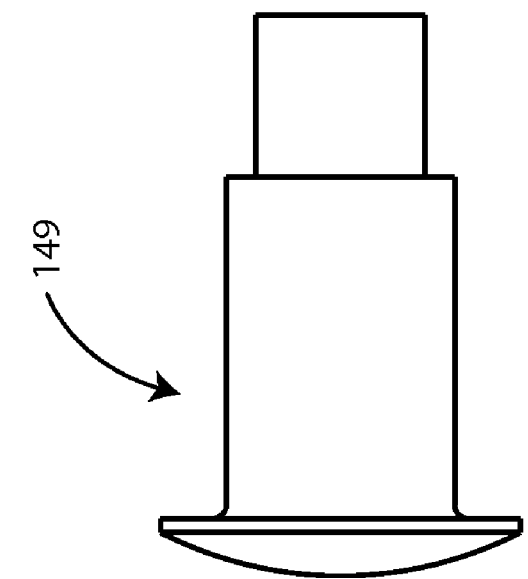
Figure 50:
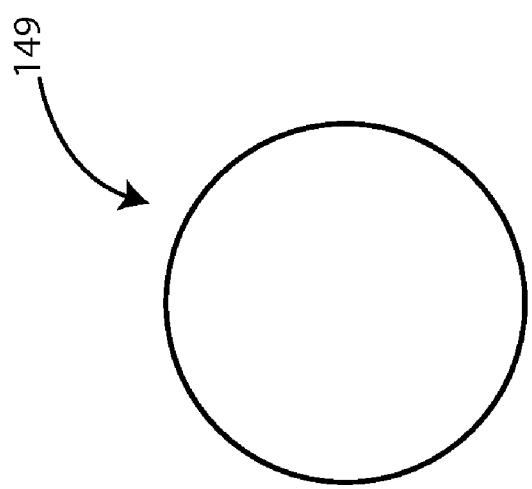
Figure 52:
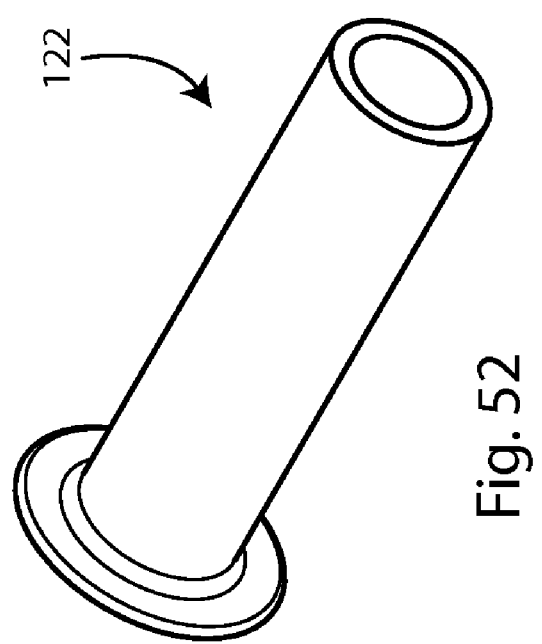
FIGS. 52-55 are views of the pivot pin connecting the actuating lever to the mounting bracket of the first leverage device of the present invention and is identical to the pivot pin connecting the first and second linkage members.

The first linkage member 107 has at least one hole 135 in its second end portion 127. The second linkage member 109 is best illustrated in FIGS. 38-40. The second linkage member 109 has a first end portion 137 and a second end portion 139. The second linkage member 109 has at least one hole 141 in its first end portion that is in registry with the hole 135 in the second end portion of the first linkage member 107. The pivot pin 143 extends through the holes 135 and 141 to pivotally attach the second linkage member 109 to the first linkage member 107.

The mounting bracket 106 has at least one elongated slot 124 intermediate its first end portion and its second end portion. In the illustrated example, the elongated slot 124 is located intermediate the first end portion of the mounting bracket 106 and the second end portion of the mounting bracket 106. In the illustrated example, the elongated slot 124 is located intermediate the middle 145 of the mounting bracket 106 and the pivotal attachment between the actuating lever 108 and the mounting bracket 106. In the illustrated example, the mounting bracket 106 has two elongated slots 124 and 126 provided in side plates 114 and 116. In the illustrated example, the elongated slots 124 and 126 are located intermediate the first end portion of the mounting bracket 106 and the second end portion of the mounting bracket 106. In the illustrated example, the elongated slots 124 and 126 are located intermediate the middle 145 of the mounting bracket 106 and the pivotal attachment between the actuating lever 108 and the mounting bracket 106. The pivot pin 143 extends into at least one elongated slot 124 or 126 such that the pivot pin 143 and consequently the pivotal attachment between the first linkage member 107 and the second linkage member 109, the second end portion of the first linkage member 107, and the first end portion of the second linkage member 109 are limited to rectilinear motion parallel to the longitudinal axis of the mounting bracket 106. The elongated slots 124 and 126 extend parallel to the longitudinal axis of the mounting bracket 106. Accordingly, as the actuating lever 108 is pivotally moved between a fully raised position and a folded-down position, the pivot pin 143, the pivotal attachment between the first linkage member 107 and the second linkage member 109, the second end portion of the first linkage member 107, and the first end portion of the second linkage member 109 all move rectilinearly relative to the mounting bracket 106.

The cam 110 is rotationally supported by the mounting bracket 106 in the second end portion of the mounting bracket 106 that is distal from the first end portion of the mounting bracket 106. The cam 110 has an axis of rotation defined by the pivot pin 149 and is located in the second end portion of the mounting bracket 106. The pivot pin 149 engages at least one hole in the cam 110 and at least one hole 153 in the second end portion of the mounting bracket 106 to provide for the rotational support of the cam 110 by the mounting bracket 106. In the illustrated embodiment, at least a part of the third side plate 118 faces the side plate 114 in the second end portion of the mounting bracket 106. The hole 153 is provided in the side plate 114 and a hole 155 is provided in the side plate 118. The holes 153 and 155 are in registry with each other. The pivot pin 149 engages the hole 157 in the cam 110 and the holes 153 and 155 in the second end portion of the mounting bracket 106 to provide for the rotational support of the cam 110 by the mounting bracket 106. The cam 110 has a projecting finger 128 designed to engage an opening 151 in the shelf 104 and rectilinearly move the electronic module to which the leverage device 100 is attached between an initial position and a final or installed position as the cam 110 rotates relative to the mounting bracket 106.

The second end of the second linkage member 109 is pivotally connected to the cam 110 by the pivot shaft 159. The pivot shaft 159 fits into a hole 167 provided in the second end of the second linkage member 109 to pivotally connect the second linkage member 109 to the cam 110. The pivot shaft 159 is spaced apart from the pivot shaft 149 such that the pivotal attachment or connection between the second linkage member 109 and the cam 110 is offset or eccentric relative to the axis of rotation of the cam 110 as defined by the pivot pin 149. Accordingly, as the pivotal attachment between the first linkage member 107 and the second linkage member 109 moves rectilinearly relative to the mounting bracket 106 due to the pivotal movement of the actuating lever 108 between the fully raised position and the folded-down position, the cam 110 rotates about the pivot pin 149 due to the eccentric position of the pivot pin 159 relative to the pivot pin 149.

In operation, the electronic module 102 having installed on it the device 100, is placed in its initial position on the shelf 104 in its respective open front compartment with the actuating lever 108 in its fully raised position such that the finger 128 is in the proper initial position relative to the opening 151 in the shelf 104. As the actuating lever 108 is pivotally moved by a user from the fully raised position to the folded-down position, the pivotal attachment between the first linkage member 107 and the second linkage member 109 moves rectilinearly relative to the mounting bracket 106 toward the second end portion of the mounting bracket so as to cause the cam 110 to rotate in a first direction and bring the finger 128 into the opening 151 and into contact with the outer edge 161 of the opening 151. As the movement of the actuating lever 108 from the fully raised position to the folded-down position nears completion, the finger 128 of the cam 110 pushes against the outer edge 161 of the opening 151 to rectilinearly move the electronic module 102 inward relative to the shelf 104 toward its final installed position such that the electronic module 102 will be in its final installed position when the actuating lever 108 is in its folded-down position. The cam 110 and finger 128 are now in their second positions relative to the mounting bracket 106.

When the electronic module 102 is in its final installed position, the axis of rotation of the cam 110 has moved closer to the inner edge 163 of the opening 151 as compared to the axis of rotation of the cam 110 when the electronic module 102 was in its initial position. Therefore, when the actuating lever 108 is pivotally moved from the folded-down position to the fully raised position with the electronic module initially in its final installed position, the pivotal attachment between the first linkage member 107 and the second linkage member 109 moves rectilinearly relative to the mounting bracket 106 toward the first end portion of the mounting bracket so as to cause the cam 110 to rotate in a second direction opposite the first direction and bring the finger 128 into contact with the inner edge 163 of the opening 151. As the movement of the actuating lever 108 from the folded-down position to the fully raised position nears completion, the finger 128 of the cam 110 pushes against the inner edge 163 of the opening 151 to rectilinearly move the electronic module 102 outward relative to the shelf 104 toward its initial position such that the electronic module 102 will be in its initial position. As the motion of the actuating lever 108 continues to its fully raised position, the finger 128 is lifted out of the opening 151 such that it cannot interfere with the removal of the electronic module 102 from the shelf 104. The cam 110 and finger 128 are now in their first positions relative to the mounting bracket 106. The electronic module 102 can then be removed from the shelf 104 for repair or replacement. The rectilinear motion of the electronic module 102, caused by the rotation of the cam 110, is in a direction perpendicular to the front surface 101 of the electronic module 102 and to the longitudinal axis of the mounting bracket 106.

The direction of rotation of the cam 110 is opposite the direction of rotation of the actuating lever 108. If the actuating lever 108 is rotated counterclockwise then the cam 110 rotates clockwise. If the actuating lever 108 is rotated clockwise then the cam 110 rotates counterclockwise. The rotation or pivotal movement of the actuating lever 108 between the fully raised position and the folded-down position is in the range of 60° to 75°. More specifically, the actuating lever 108 moves through an angle of approximately 65° as the actuating lever 108 pivotally moves between the fully raised position and the folded-down position. The rectilinear motion of the electronic module caused by the rotation of the cam 110 is approximately 15 mm. The rotation or pivotal movement of the cam 110 between its first position and its second position may be in the range of 35° to 120°. In the illustrated example, the more preferred range of rotation of the cam 110 is 40° to 95° as the actuating lever 108 pivotally moves between the fully raised position and the folded-down position. An even more preferred range of rotation for the cam 110, as the actuating lever 108 pivotally moves between the fully raised position and the folded-down position, is 45° to 90° in this example. In the illustrated embodiment, the cam 110 moves through an angle of approximately 70° as the actuating lever 108 pivotally moves between the fully raised position and the folded-down position. The leverage device 100 can be provided with means for securing the actuating lever 108 in its folded-down position.

The hole 123 in the actuating lever 108 is elongated to form a slot. This feature allows the actuating lever 108 to move through approximately 18° between the folded-down position and an intermediate position between the folded-down position and the fully raised position without any movement of the pivotal attachment of the first linkage member 107 with the second linkage member 109 and consequently without any movement of the second linkage member 109 and the cam 110. The slot or hole 123 allows the first end portion of the actuating member 108 to move rectilinearly and pivotally relative to the mounting bracket 106 and relative to the pivotal attachment of the first linkage member 107 with the second linkage member 109 as the actuating lever 108 moves between the folded-down position and the intermediate position. In the illustrated embodiment, the holes 119, 120, 121, 129, 131, 135, 141, 153, 155, 157, 165, and 167 are circular; only the holes 123, 124, and 126 are elongated slots. The actuating lever 108 has an arced surface 156 at its first end portion that engages the base plate of the mounting bracket 106 to maintain the pivot pin 122 at the end of the slot 123 that is farthest from the second end portion of the actuating lever 108 until the actuating lever 108 is between its intermediate position and its folded-down position.

The leverage device 100 includes a torsion spring 132 that has a coiled portion 134, a first arm 136, and a second arm 138. The spring 132 is located at the first end portion of the mounting bracket 106 and it is positioned such that its coiled portion 134 surrounds the pivot pin 122. In other words the pivot pin 122 extends through the coiled portion 134 of the torsion spring 132. The spring arm 136 presses against the actuating lever 108 and the spring arm 138 presses against the mounting bracket 106, such that the spring 132 biases the actuating lever 108 away from its folded-down position and toward its intermediate and fully raised positions.

Figure 14:
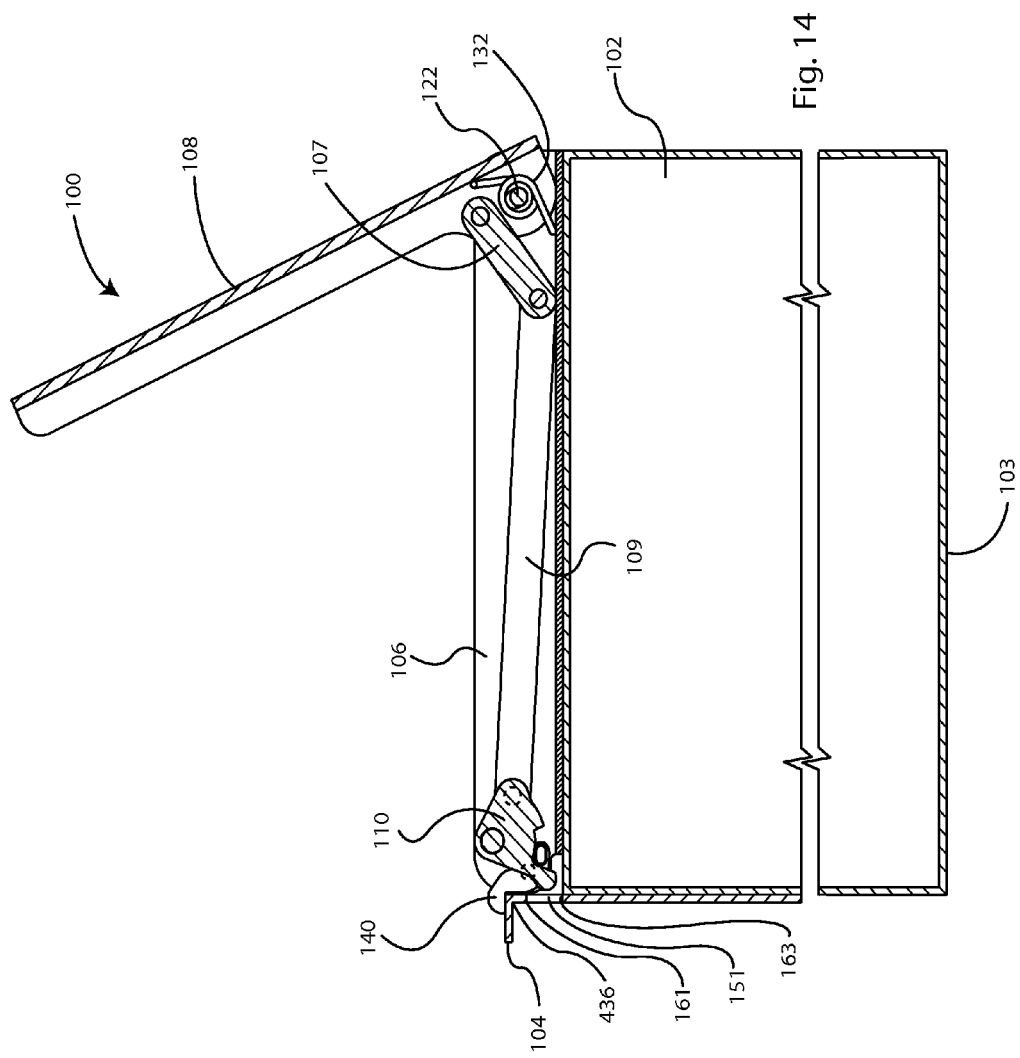
FIGS. 14-18 are environmental, cross-sectional views of the first leverage device of the leverage system of the present invention in various stages of operation.
Figure 15:
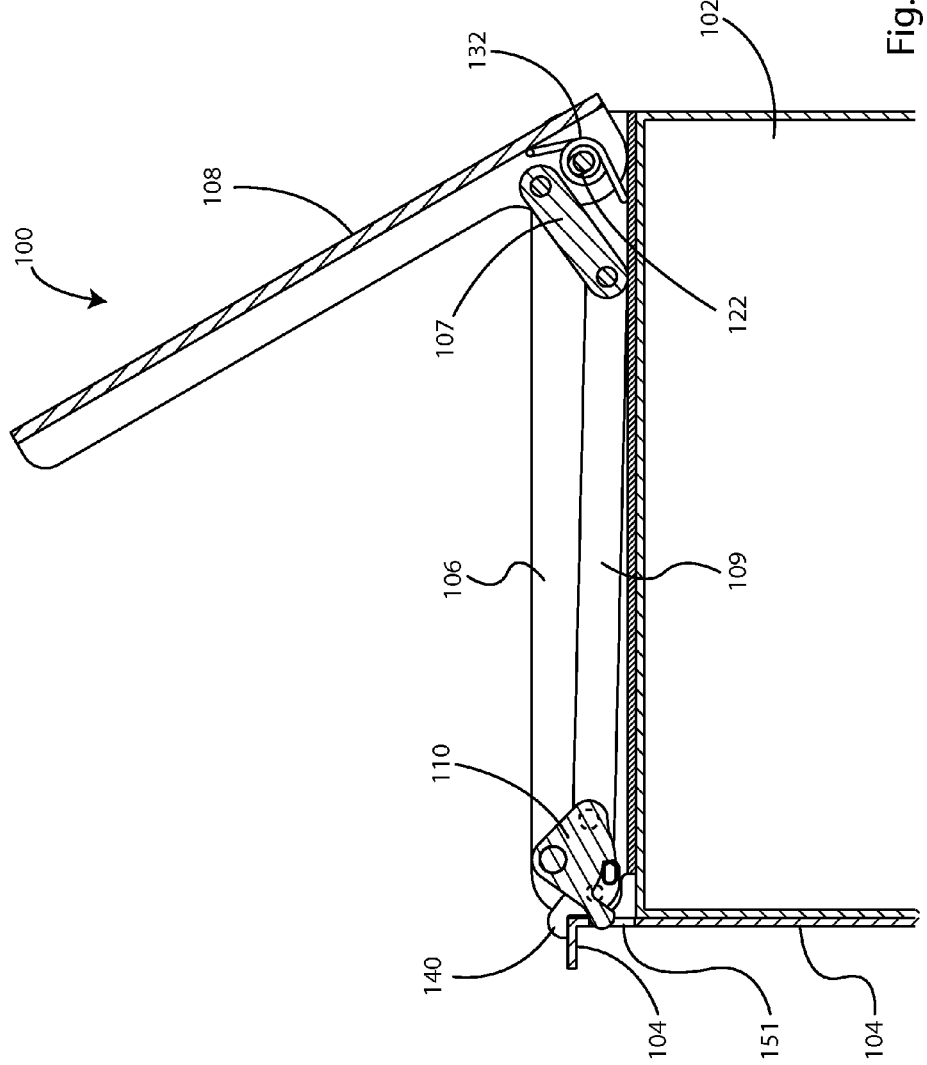
Figure 16:
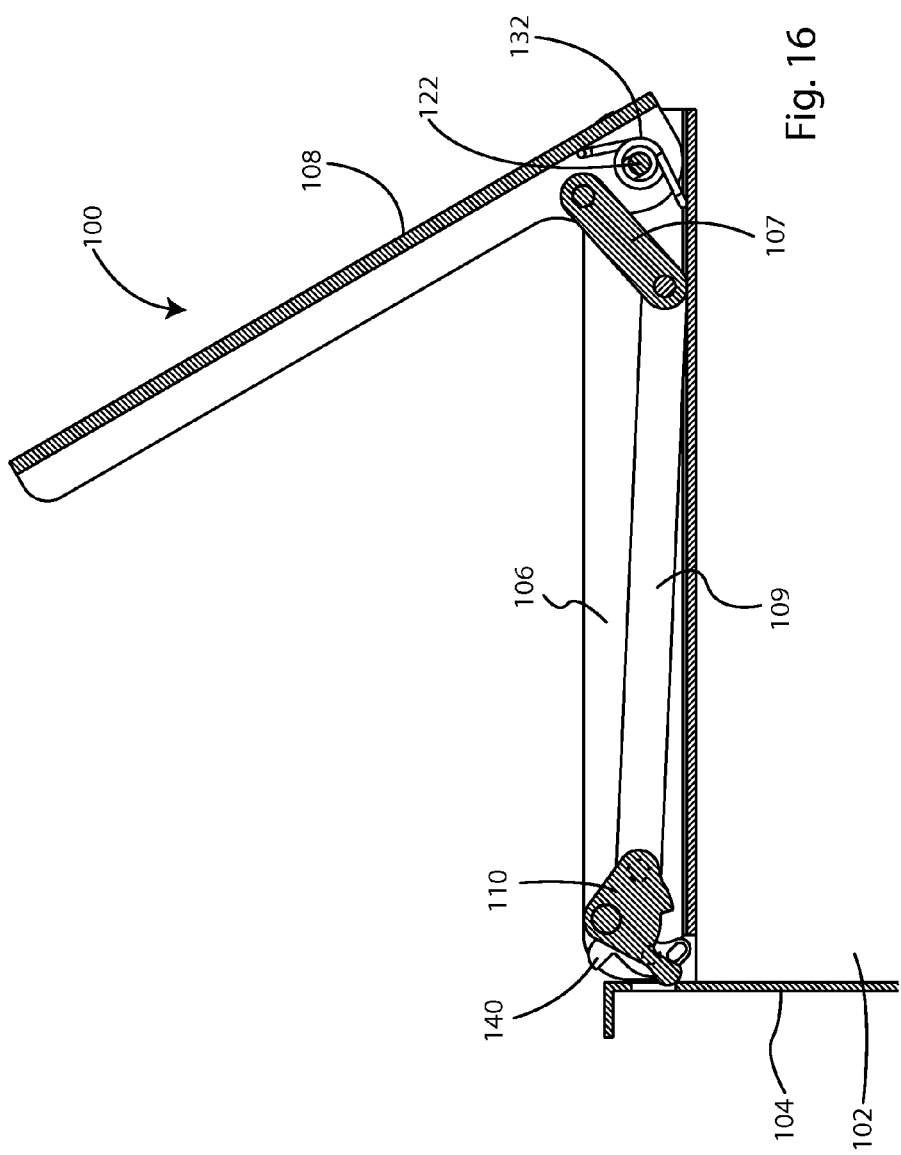
Figure 17:
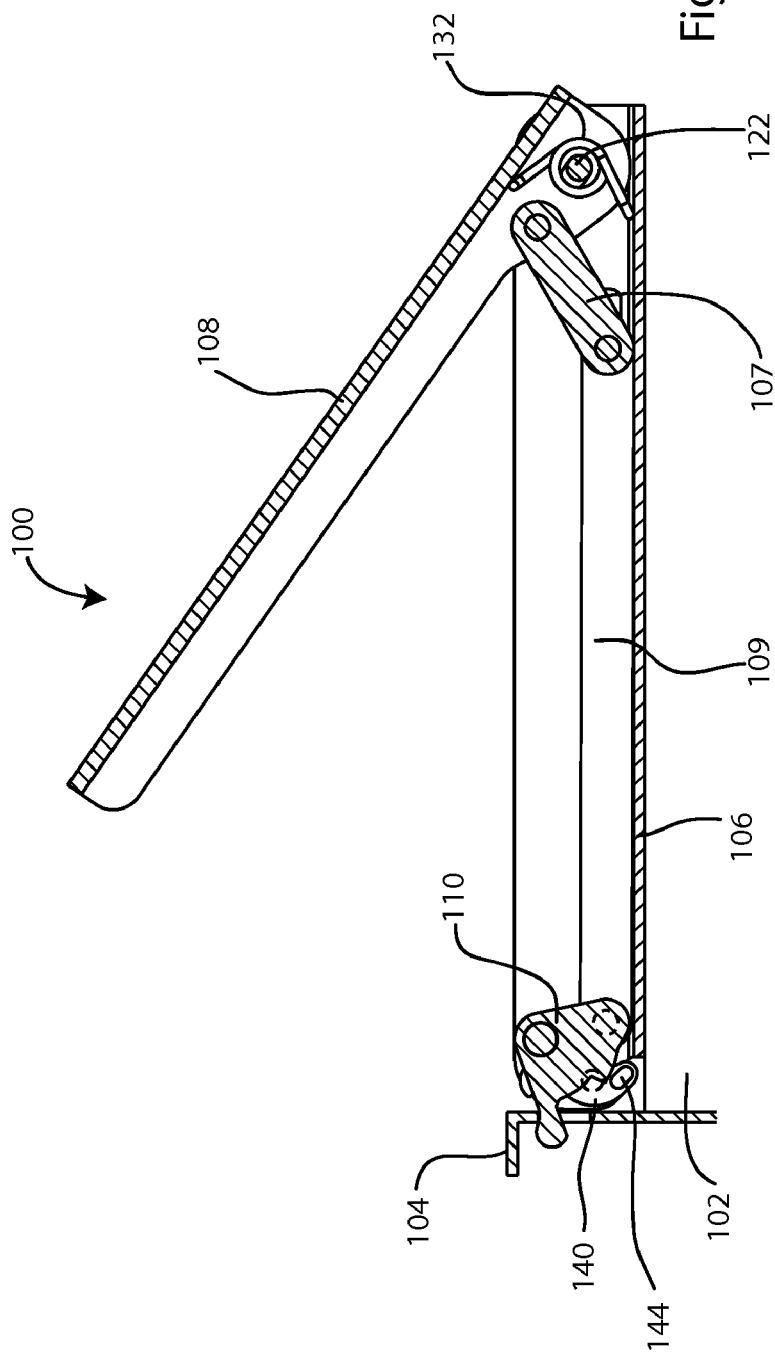
Figure 18:
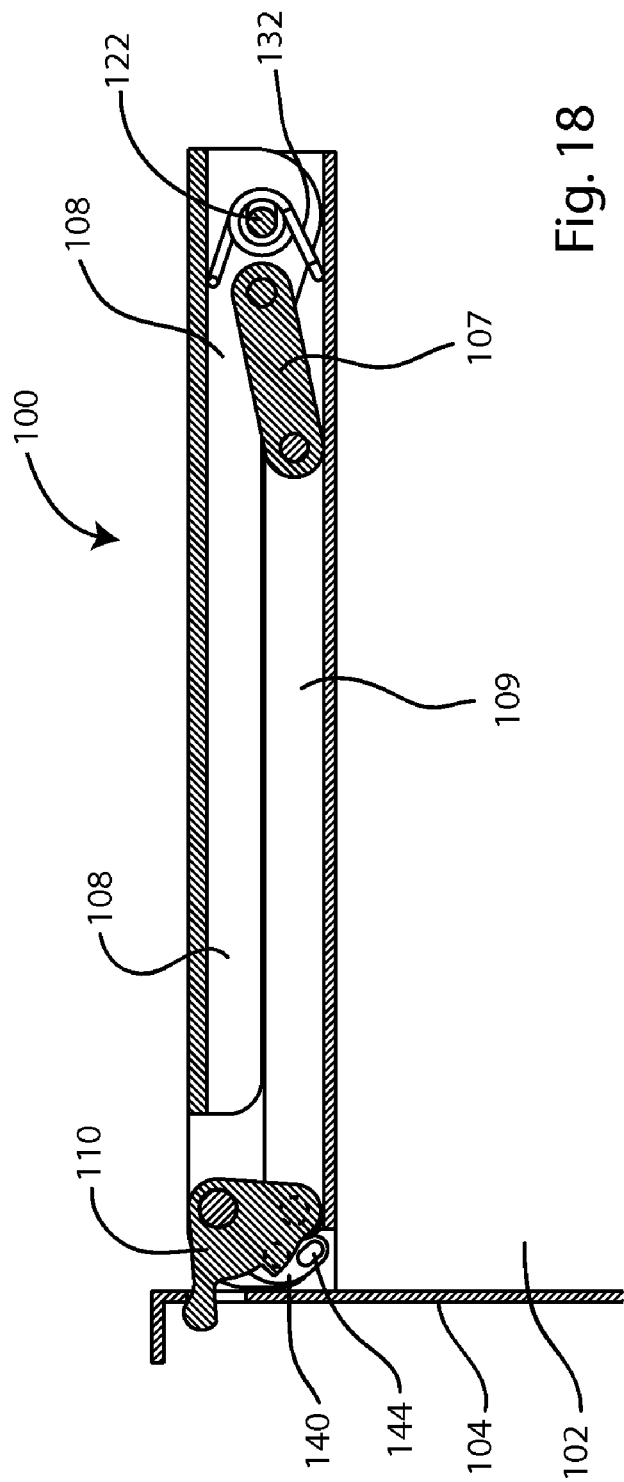
Figure 23:
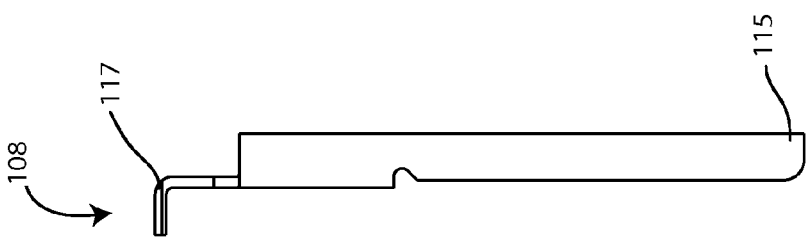
Figure 22:
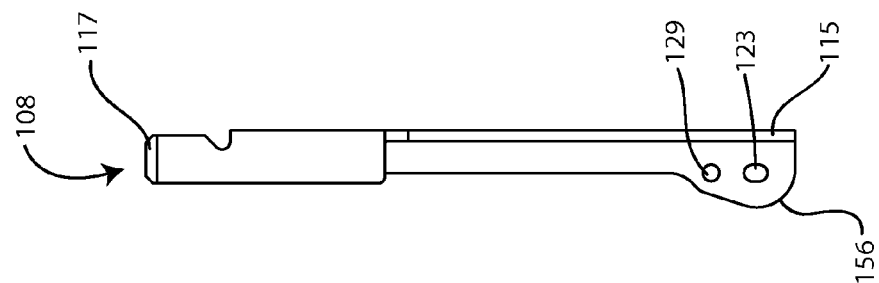
Figure 21:
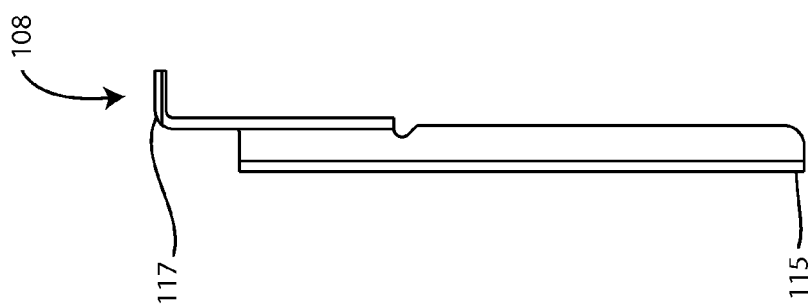
Figure 28:
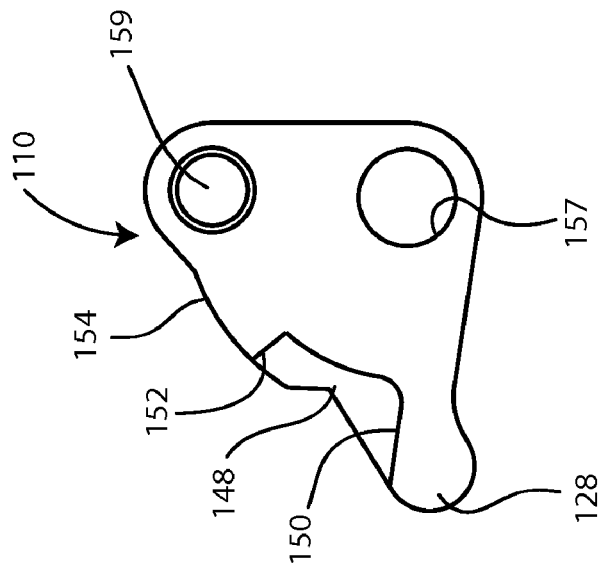
Figure 27:
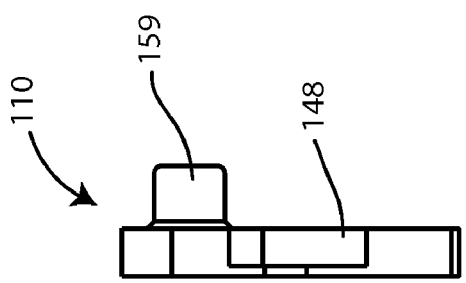
Figure 26:
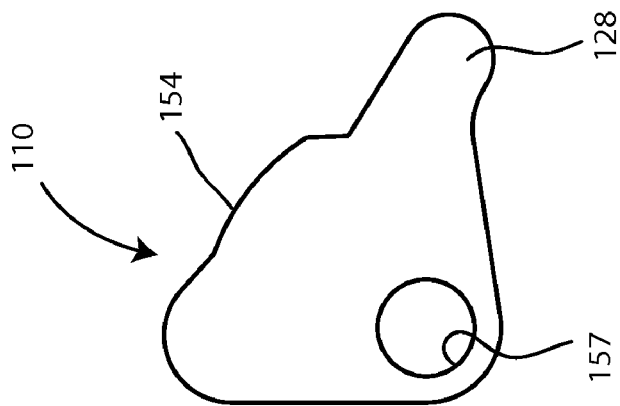
Figures 34, 35:
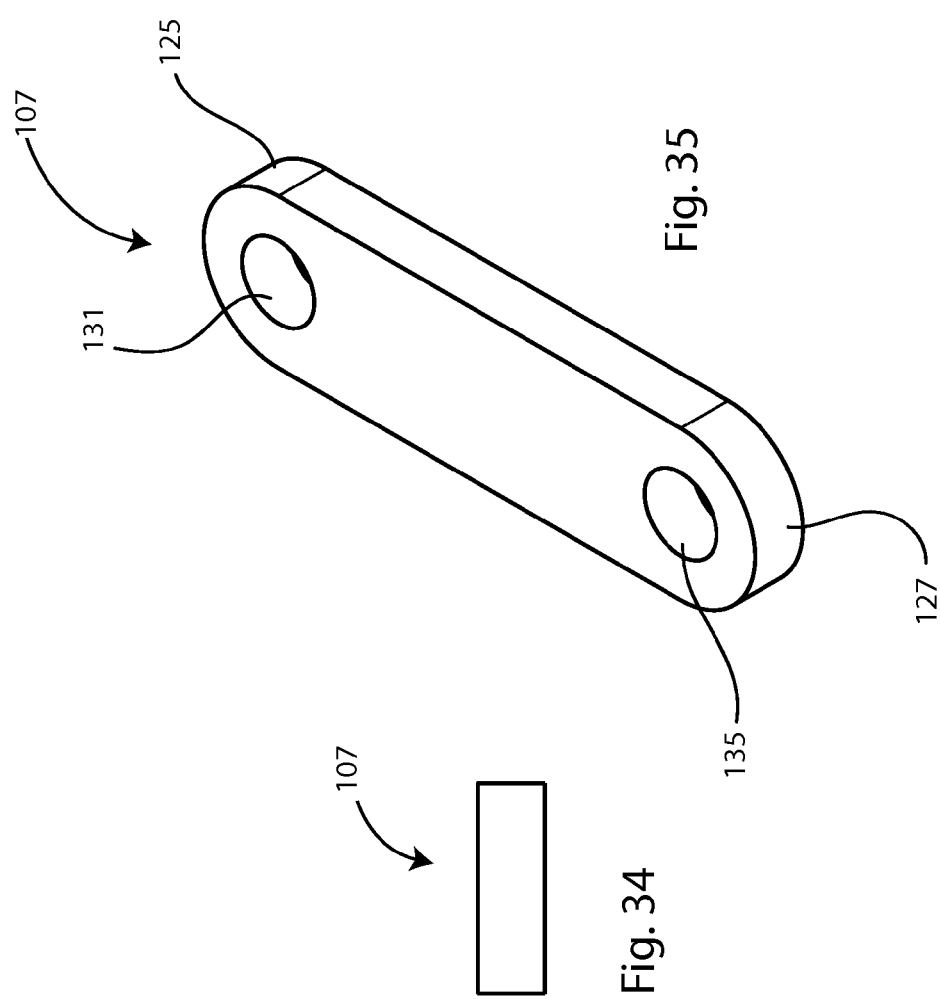

The leverage device 100 also includes a stop hook 140 that has a catch surface 142 and an actuating lug 144. The stop hook 140 also has a pivot shaft 146, located intermediate the catch surface 142 and the lug 144, that fits into the hole 165 in the side plate 114 of the mounting bracket 106 in the second end portion of the mounting bracket 106. The stop hook 140 is pivotally movable about the pivot shaft 146 between an extended position and a retracted position relative to the mounting bracket 106. As the electronic module 102 is inserted into its compartment in the shelf 104, the catch surface 142 of the stop hook 140 catches the edge 436 of the shelf 104 to prevent the electronic module 102 from moving inward relative to the shelf 104 beyond its proper initial position relative to the shelf 104 as shown in FIG. 14. The cam 110 has an arcuate recess 148 that receives the lug 144 when the cam 110 is in its first position shown in FIG. 14. When the cam 110 is in its first position, a surface 150 of the recess 148 that is nearest the projecting finger 128 contacts the lug 144 to keep the hook 140 in the extended position. During the rotation of the cam 110 from its first position to its second position and before the projecting finger 128 contacts the outer edge 161 of the opening 151, a cam surface 152 of the recess 148 that is farthest from the projecting finger 128 acts on the lug 144 to pivot the hook 140 to the retracted position such that the hook 140 is in the retracted position when the projecting finger 128 engages the outer edge 161 of the opening 151. Thus, the hook 140 is out of the way and the electronic module 102 can move to its final installed position relative to the shelf 104, as the cam 110 completes its movement to its second position as shown in FIG. 18. When the lug 144 is out of the recess 148 it is in contact with the outer arcuate surface 154 of the cam 110, which maintains the hook 140 in its retracted position. As the cam 110 rotates back to its first position, first the projecting finger 128 and then the cam surface 150 act on the lug 144 to pivot the hook 140 to the extended position when the electronic module 102 is levered back to its initial position.

In the illustrated example, the leverage device 100 is used as part of a leverage system 300 that is mounted to the front face of the electronic module 102. The leverage system 300 includes the first leverage device 100, a second leverage device 200, and a handle or grip 302. The second leverage device 200 is a mirror image of the first leverage device 100 and it works in exactly the same way. The leverage devices 100 and 200 are mounted on either side of the front face of the electronic module 102.

Referring to FIGS. 1-10 and 56-97, the leverage device 200 for leveraging a first member from an initial position into a final position relative to a second member can be seen. The leverage device 200 of the present invention releasably secures the first member, such as an electronic module 102, to a second member, such as a shelf 104 (only a portion of the shelf is shown). The electronic module 102 is diagrammatically illustrated as a rectangular box in the attached drawings. The electronic module 102 has a front surface 101, a rear surface 103, and side surfaces 105. The leverage device 200 mounts to the front surface 101 of the electronic module 102. The rear surface 103, or maybe the sides 105, of the electronic module 102 is provided with one or more electrical connectors (not shown) that interface with mating electrical connectors (not shown) in the shelf 104 to electrically connect the electronic module to the rest of the electronic system (not shown). The leverage device 200 of the present invention at least includes a mounting bracket 206, an actuating lever 208, a first linkage member 207, a second linkage member 209, and a cam 210.

The mounting bracket 206 is best illustrated in FIGS. 71-75. The mounting bracket 206 is elongated and has a first end portion 211, a second end portion 213. In the illustrated example, the mounting bracket 206 includes a base plate 212, and at least one side plate 214 extending perpendicularly from the base plate 212. In the illustrated example, the mounting bracket 206 further includes a second side plate 216 and a third side plate 218, in addition to the first side plate 214. The base plate 212 has holes 219 that allow the mounting bracket 206 to be mounted to the front surface 101 of the electronic module 102 using appropriate fasteners such as screws, rivets or the like. The base plate 212 of the mounting bracket 206 abuts the front surface 101 of the electronic module 102 once the mounting bracket 206 is installed to the electronic module 102. The actuating lever 208 is best illustrated in FIGS. 61-65. The actuating lever 208 has a first end portion 215 and a second end portion 217. The first end portion of the actuating lever 208 is pivotally connected to the first end portion of the mounting bracket 206 to thereby pivotally attach the actuating lever 208 to the mounting bracket 206. At least a portion of the second side plate 216 is located at the first end portion of the mounting bracket 206 in facing relationship to the first side plate 214. The side plate 214 of the mounting bracket 206 has a hole 220 located in the first end portion of the mounting bracket 206. The side plate 216 has a hole 221 that is in registry with the hole 220 of the side plate 214 of the mounting bracket 206. The actuating lever 208 has at least one hole 223 in its first end portion 215. The pivot pin 222 extends through the holes 220, 221, and 223 to pivotally attach the actuating lever 208 to the mounting bracket 206.

The first linkage member 207 is best illustrated in FIGS. 76-79. The first linkage member 207 has a first end portion 225 and a second end portion 227. The first linkage member 207 is pivotally connected to the actuating lever 208. The first end portion of the first linkage member 207 is pivotally connected to the actuating lever 208 at a location spaced apart from the axis of rotation of the pivotal attachment between the actuating lever 208 and the mounting bracket 206 as defined by the pivot pin 222. In the illustrated example, the pivotal attachment between the actuating lever 208 and the first linkage member 207 is located intermediate the second end portion of the actuating lever 208 and the pivotal attachment between the actuating lever 208 and the mounting bracket 206, with the pivotal attachment between the actuating lever 208 and the first linkage member 207 being located closer to the pivotal attachment between the actuating lever 208 and the mounting bracket 206 than to the second end portion of the actuating lever 208. In the illustrated example, the pivotal attachment between the actuating lever 208 and the first linkage member 207 is located intermediate the middle 247 of the actuating lever 208 and the pivotal attachment between the actuating lever 208 and the mounting bracket 206, with the pivotal attachment between the actuating lever 208 and the first linkage member 207 being located closer to the pivotal attachment between the actuating lever 208 and the mounting bracket 206 than to the middle 247 of the actuating lever 208. The actuating lever 208 has at least one hole 229 at a location corresponding to the pivotal attachment between the actuating lever 208 and the first linkage member 207. The first linkage member 207 has at least one hole 231 in its first end portion that is in registry with the hole 229 of the actuating lever 208. The pivot pin 233 extends through the holes 229 and 231 to pivotally attach the first linkage member 207 to the actuating lever 208. The middle of a member as used herein is the midline of the member with respect to its length, and the midline is the perpendicular bisector of the length of the member.

Figure 80:
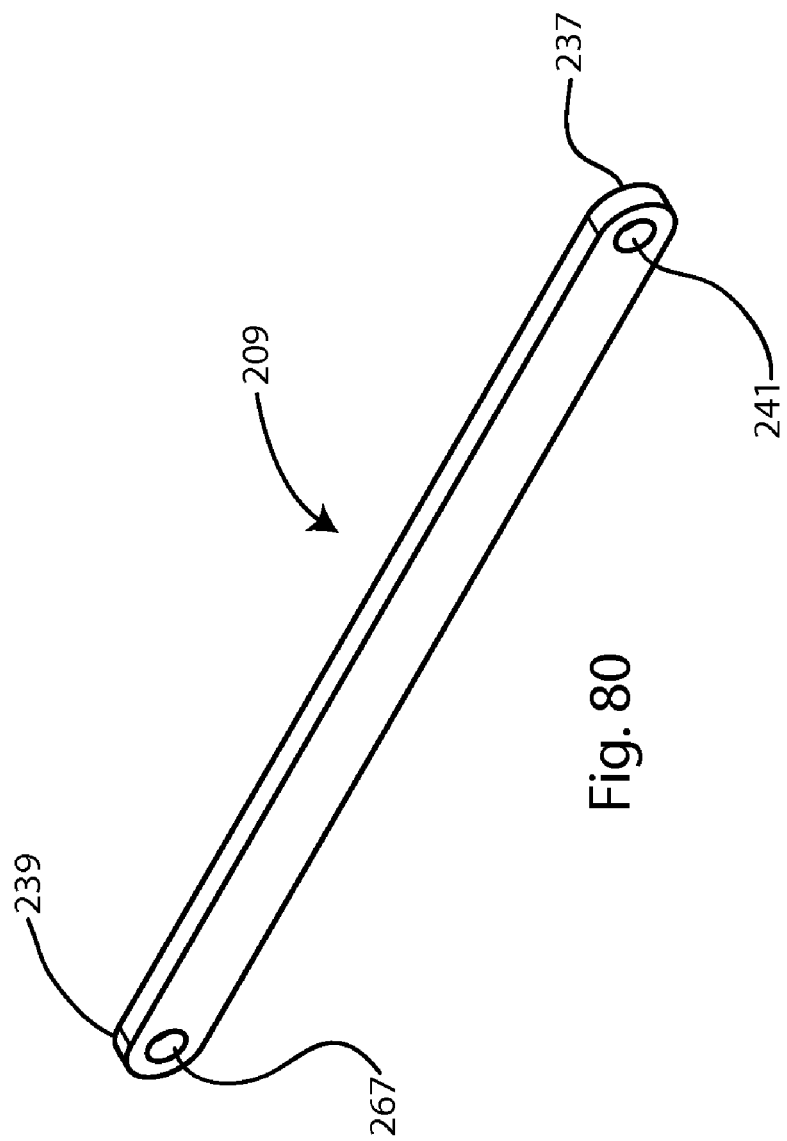
Figure 83:
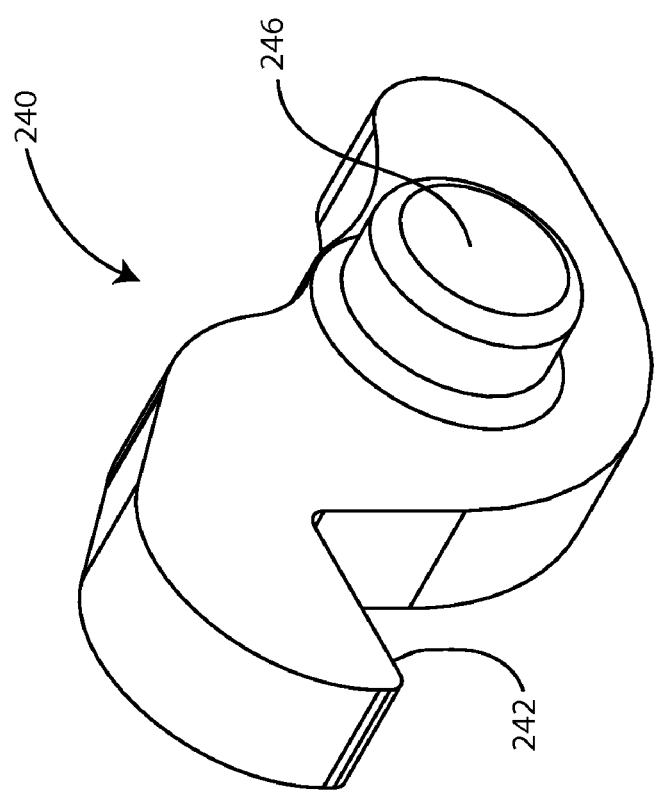
FIGS. 83-84 are views of the stop hook of the second leverage device of the present invention.
Figure 84:
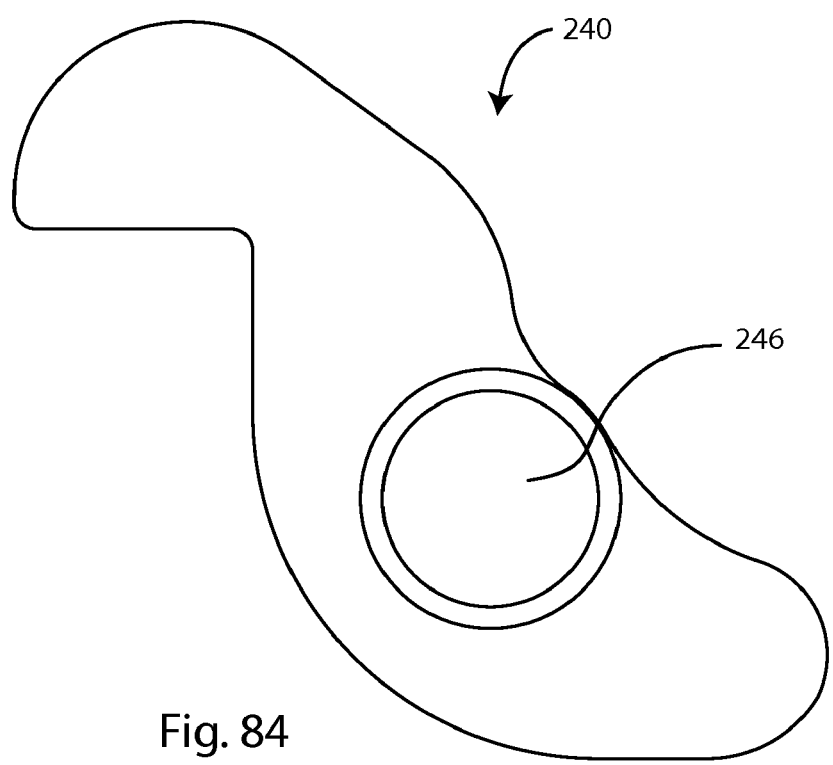
Figure 85:
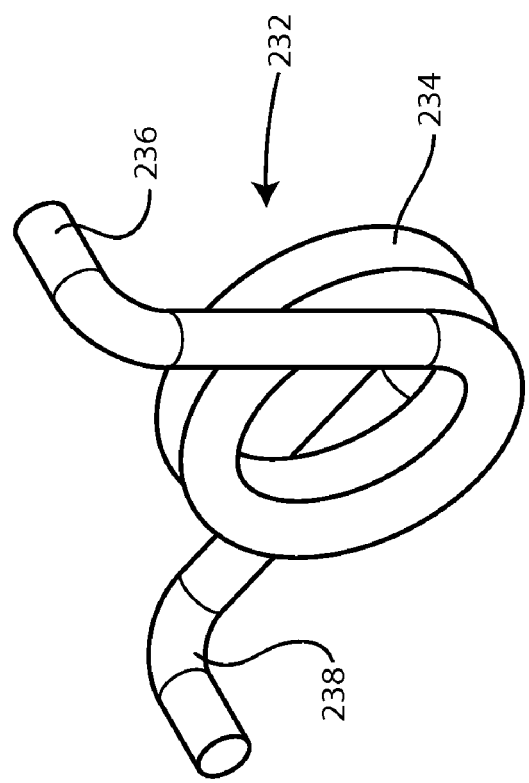
FIG. 85 is an isometric view of the torsion spring of the second leverage device of the present invention.
Figure 87:
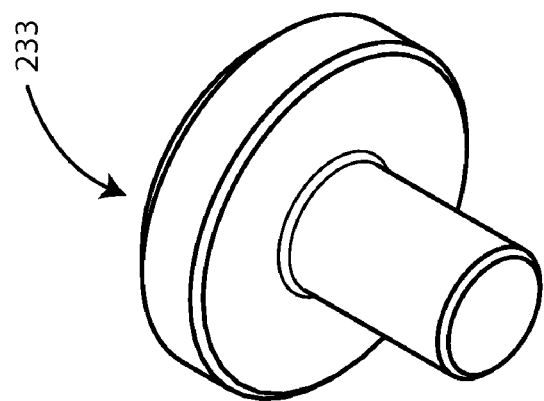
FIGS. 86-89 are views of the pivot pin connecting the actuating lever to the first linkage member of the second leverage device of the present invention.
Figure 86:
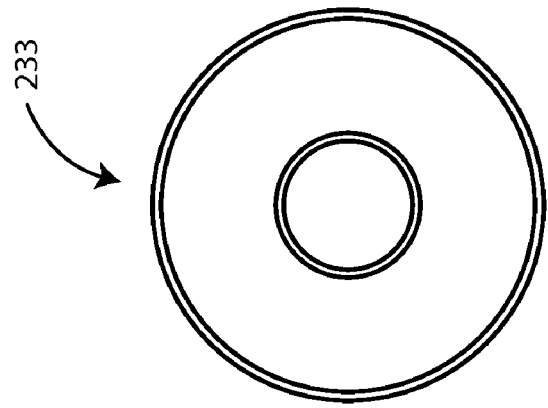
Figure 89:
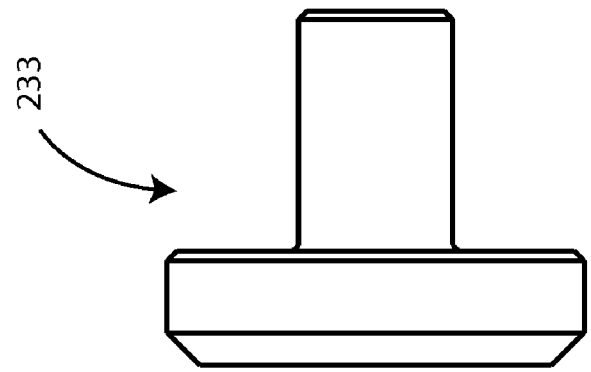
Figure 88:
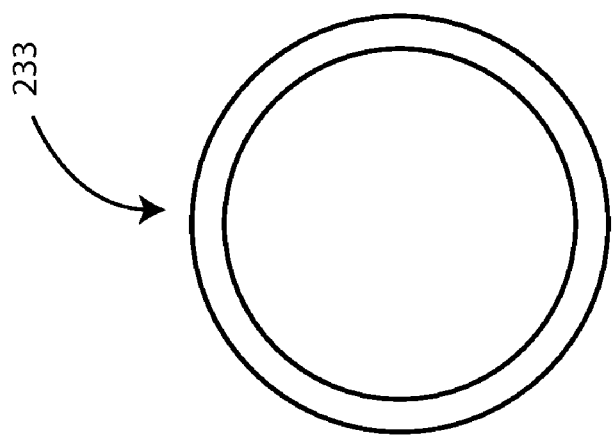
Figure 91:
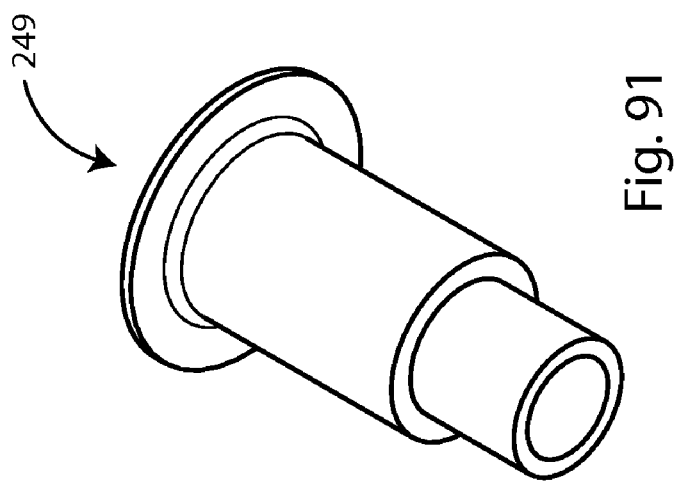
FIGS. 90-93 are views of the pivot pin connecting the cam to the mounting bracket of the second leverage device of the present invention.
Figure 90:
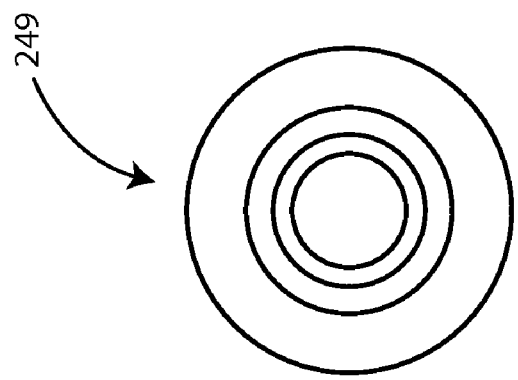
Figure 93:
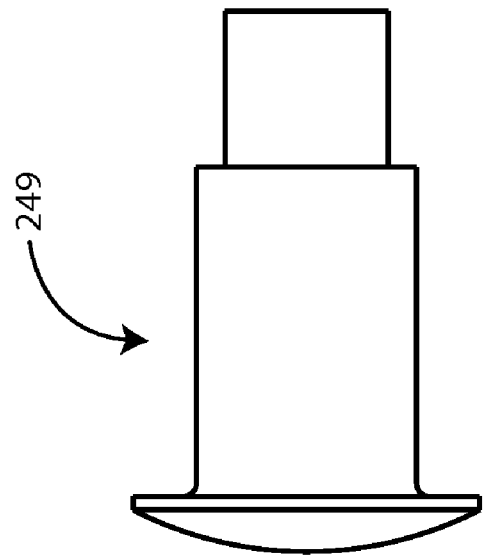
Figure 92:
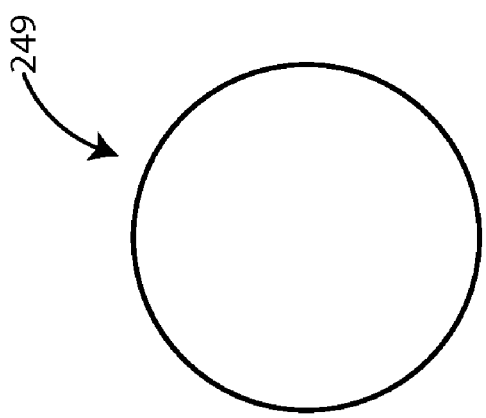
Figure 94:
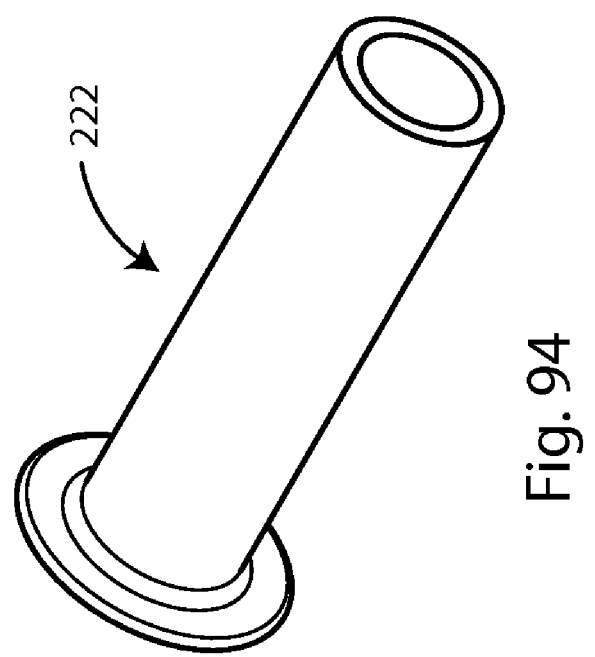
FIGS. 94-97 are views of the pivot pin connecting the actuating lever to the mounting bracket of the second leverage device of the present invention and is identical to the pivot pin connecting the first and second linkage members.
Figure 97:
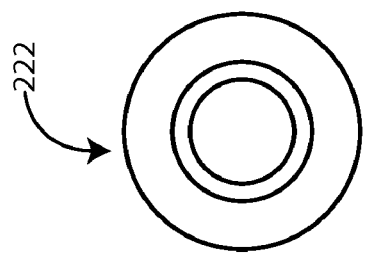
Figure 96:
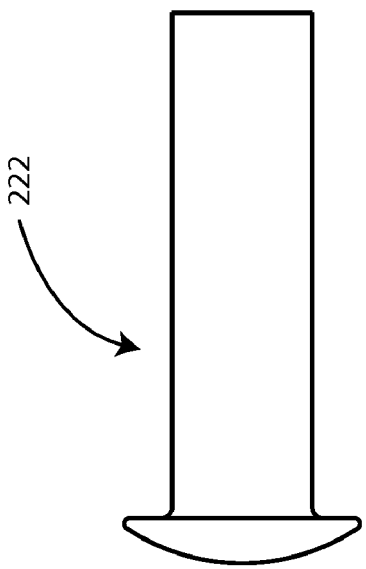
Figure 95:
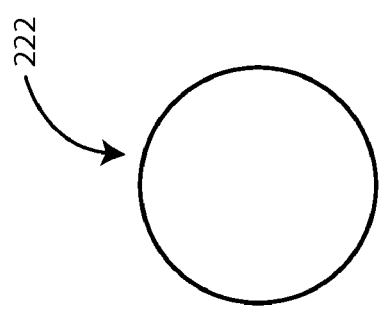
Figure 100:
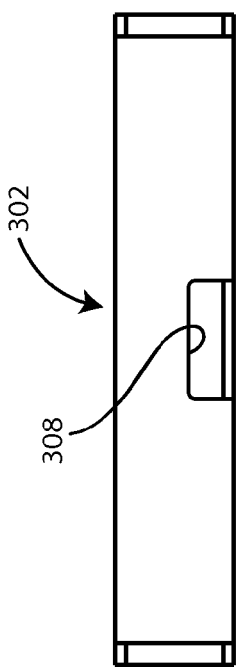
Figure 101:
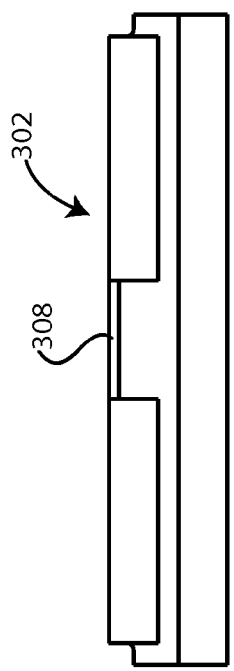
Figure 102:
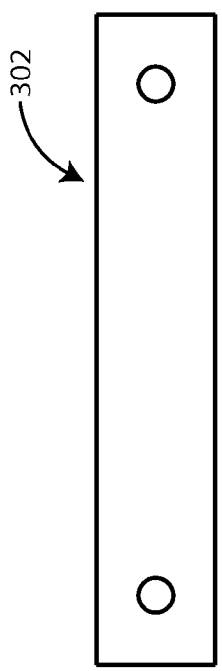
Figure 103:
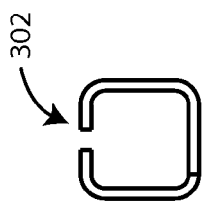

The first linkage member 207 has at least one hole 235 in its second end portion 227. The second linkage member 209 is best illustrated in FIGS. 80-82. The second linkage member 209 has a first end portion 237 and a second end portion 239. The second linkage member 209 has at least one hole 241 in its first end portion that is in registry with the hole 235 in the second end portion of the first linkage member 207. The pivot pin 243 extends through the holes 235 and 241 to pivotally attach the second linkage member 209 to the first linkage member 207.

The mounting bracket 206 has at least one elongated slot 224 intermediate its first end portion and its second end portion. In the illustrated example, the elongated slot 224 is located intermediate the first end portion of the mounting bracket 206 and the second end portion of the mounting bracket 206. In the illustrated example, the elongated slot 224 is located intermediate the middle 245 of the mounting bracket 206 and the pivotal attachment between the actuating lever 208 and the mounting bracket 206. In the illustrated example, the mounting bracket 206 has two elongated slots 224 and 226 provided in side plates 214 and 216. In the illustrated example, the elongated slots 224 and 226 are located intermediate the first end portion of the mounting bracket 206 and the second end portion of the mounting bracket 206. In the illustrated example, the elongated slots 224 and 226 are located intermediate the middle 245 of the mounting bracket 206 and the pivotal attachment between the actuating lever 208 and the mounting bracket 206. The pivot pin 243 extends into at least one elongated slot 224 or 226 such that the pivot pin 243 and consequently the pivotal attachment between the first linkage member 207 and the second linkage member 209, the second end portion of the first linkage member 207, and the first end portion of the second linkage member 209 are limited to rectilinear motion parallel to the longitudinal axis of the mounting bracket 206. The elongated slots 224 and 226 extend parallel to the longitudinal axis of the mounting bracket 206. Accordingly, as the actuating lever 208 is pivotally moved between a fully raised position and a folded-down position, the pivot pin 243, the pivotal attachment between the first linkage member 207 and the second linkage member 209, the second end portion of the first linkage member 207, and the first end portion of the second linkage member 209 all move rectilinearly relative to the mounting bracket 206.

The cam 210 is rotationally supported by the mounting bracket 206 in the second end portion of the mounting bracket 206 that is distal from the first end portion of the mounting bracket 206. The cam 210 has an axis of rotation defined by the pivot pin 249 and is located in the second end portion of the mounting bracket 206. The pivot pin 249 engages at least one hole in the cam 210 and at least one hole 253 in the second end portion of the mounting bracket 206 to provide for the rotational support of the cam 210 by the mounting bracket 206. In the illustrated embodiment, at least a part of the third side plate 218 faces the side plate 214 in the second end portion of the mounting bracket 206. The hole 253 is provided in the side plate 214 and a hole 255 is provided in the side plate 218. The holes 253 and 255 are in registry with each other. The pivot pin 249 engages the hole 257 in the cam 210 and the holes 253 and 255 in the second end portion of the mounting bracket 206 to provide for the rotational support of the cam 210 by the mounting bracket 206. The cam 210 has a projecting finger 228 designed to engage an opening 251 in the shelf 104 and rectilinearly move the electronic module to which the leverage device 200 is attached between an initial position and a final or installed position as the cam 210 rotates relative to the mounting bracket 206.

The second end of the second linkage member 209 is pivotally connected to the cam 210 by the pivot shaft 259. The pivot shaft 259 fits into a hole 267 provided in the second end of the second linkage member 209 to pivotally connect the second linkage member 209 to the cam 210. The pivot shaft 259 is spaced apart from the pivot shaft 249 such that the pivotal attachment or connection between the second linkage member 209 and the cam 210 is offset or eccentric relative to the axis of rotation of the cam 210 as defined by the pivot pin 249. Accordingly, as the pivotal attachment between the first linkage member 207 and the second linkage member 209 moves rectilinearly relative to the mounting bracket 206 due to the pivotal movement of the actuating lever 208 between the fully raised position and the folded-down position, the cam 210 rotates about the pivot pin 249 due to the eccentric position of the pivot pin 259 relative to the pivot pin 249.

In operation, the electronic module 102 having installed on it the device 200, is placed in its initial position on the shelf 104 in its respective open front compartment with the actuating lever 208 in its fully raised position such that the finger 228 is in the proper initial position relative to the opening 251 in the shelf 104. As the actuating lever 208 is pivotally moved by a user from the fully raised position to the folded-down position, the pivotal attachment between the first linkage member 207 and the second linkage member 209 moves rectilinearly relative to the mounting bracket 206 toward the second end portion of the mounting bracket so as to cause the cam 210 to rotate in a first direction and bring the finger 228 into the opening 251 and into contact with the outer edge 261 of the opening 251. As the movement of the actuating lever 208 from the fully raised position to the folded-down position nears completion, the finger 228 of the cam 210 pushes against the outer edge 261 of the opening 251 to rectilinearly move the electronic module 102 inward relative to the shelf 104 toward its final installed position such that the electronic module 102 will be in its final installed position when the actuating lever 208 is in its folded-down position. The cam 210 and finger 228 are now in their second positions relative to the mounting bracket 206.

When the electronic module 102 is in its final installed position, the axis of rotation of the cam 210 has moved closer to the inner edge 263 of the opening 251 as compared to the axis of rotation of the cam 210 when the electronic module 102 was in its initial position. Therefore, when the actuating lever 208 is pivotally moved from the folded-down position to the fully raised position with the electronic module initially in its final installed position, the pivotal attachment between the first linkage member 207 and the second linkage member 209 moves rectilinearly relative to the mounting bracket 206 toward the first end portion of the mounting bracket so as to cause the cam 210 to rotate in a second direction opposite the first direction and bring the finger 228 into contact with the inner edge 263 of the opening 251. As the movement of the actuating lever 208 from the folded-down position to the fully raised position nears completion, the finger 228 of the cam 210 pushes against the inner edge 263 of the opening 251 to rectilinearly move the electronic module 102 outward relative to the shelf 104 toward its initial position such that the electronic module 102 will be in its initial position. As the motion of the actuating lever 208 continues to its fully raised position, the finger 228 is lifted out of the opening 251 such that it cannot interfere with the removal of the electronic module 102 from the shelf 104. The cam 210 and finger 228 are now in their first positions relative to the mounting bracket 206. The electronic module 102 can then be removed from the shelf 104 for repair or replacement. The rectilinear motion of the electronic module 102, caused by the rotation of the cam 210, is in a direction perpendicular to the front surface 101 of the electronic module 102 and to the longitudinal axis of the mounting bracket 206.

The direction of rotation of the cam 210 is opposite the direction of rotation of the actuating lever 208. If the actuating lever 208 is rotated counterclockwise then the cam 210 rotates clockwise. If the actuating lever 208 is rotated clockwise then the cam 210 rotates counterclockwise. The rotation or pivotal movement of the actuating lever 208 between the fully raised position and the folded-down position is in the range of 60° to 75°. More specifically, the actuating lever 208 moves through an angle of approximately 65° as the actuating lever 208 pivotally moves between the fully raised position and the folded-down position. The rectilinear motion of the electronic module caused by the rotation of the cam 210 is approximately 25 mm. The rotation or pivotal movement of the cam 210 between its first position and its second position may be in the range of 35° to 220°. In the illustrated example, the more preferred range of rotation of the cam 210 is 40° to 95° as the actuating lever 208 pivotally moves between the fully raised position and the folded-down position. An even more preferred range of rotation for the cam 210, as the actuating lever 208 pivotally moves between the fully raised position and the folded-down position, is 45° to 90° in this example. In the illustrated embodiment, the cam 210 moves through an angle of approximately 70° as the actuating lever 208 pivotally moves between the fully raised position and the folded-down position. The leverage device 200 can be provided with means for securing the actuating lever 208 in its folded-down position.

The hole 223 in the actuating lever 208 is elongated to form a slot. This feature allows the actuating lever 208 to move through approximately 28° between the folded-down position and an intermediate position between the folded-down position and the fully raised position without any movement of the pivotal attachment of the first linkage member 207 with the second linkage member 209 and consequently without any movement of the second linkage member 209 and the cam 210. The slot or hole 223 allows the first end portion of the actuating member 208 to move rectilinearly and pivotally relative to the mounting bracket 206 and relative to the pivotal attachment of the first linkage member 207 with the second linkage member 209 as the actuating lever 208 moves between the folded-down position and the intermediate position. In the illustrated embodiment, the holes 219, 220, 221, 229, 231, 235, 241, 253, 255, 257, 265, and 267 are circular; only the holes 223, 224, and 226 are elongated slots. The actuating lever 208 has an arced surface 256 at its first end portion that engages the base plate of the mounting bracket 206 to maintain the pivot pin 222 at the end of the slot 223 that is farthest from the second end portion of the actuating lever 208 until the actuating lever 208 is between its intermediate position and its folded-down position.

The leverage device 200 includes a torsion spring 232 that has a coiled portion 234, a first arm 236, and a second arm 238. The spring 232 is located at the first end portion of the mounting bracket 206 and it is positioned such that its coiled portion 234 surrounds the pivot pin 222. In other words the pivot pin 222 extends through the coiled portion 234 of the torsion spring 232. The spring arm 236 presses against the actuating lever 208 and the spring arm 238 presses against the mounting bracket 206, such that the spring 232 biases the actuating lever 208 away from its folded-down position and toward its intermediate and fully raised positions.

The leverage device 200 also includes a stop hook 240 that has a catch surface 242 and an actuating lug 244. The stop hook 240 also has a pivot shaft 246, located intermediate the catch surface 242 and the lug 244, that fits into the hole 265 in the side plate 214 of the mounting bracket 206 in the second end portion of the mounting bracket 206. The stop hook 240 is pivotally movable about the pivot shaft 246 between an extended position and a retracted position relative to the mounting bracket 206. As the electronic module 102 is inserted into its compartment in the shelf 104, the catch surface 242 of the stop hook 240 catches the edge 436 of the shelf 104 to prevent the electronic module 102 from moving inward relative to the shelf 104 beyond its proper initial position relative to the shelf 104 as shown in FIG. 56. The cam 210 has an arcuate recess 248 that receives the lug 244 when the cam 210 is in its first position shown in FIG. 56. When the cam 210 is in its first position, a surface 250 of the recess 248 that is nearest the projecting finger 228 contacts the lug 244 to keep the hook 240 in the extended position. During the rotation of the cam 210 from its first position to its second position and before the projecting finger 228 contacts the outer edge 261 of the opening 251, a cam surface 252 of the recess 248 that is farthest from the projecting finger 228 acts on the lug 244 to pivot the hook 240 to the retracted position such that the hook 240 is in the retracted position when the projecting finger 228 engages the outer edge 261 of the opening 251. Thus, the hook 240 is out of the way and the electronic module 102 can move to its final installed position relative to the shelf 104, as the cam 210 completes its movement to its second position as shown in FIG. 60. When the lug 244 is out of the recess 248 it is in contact with the outer arcuate surface 254 of the cam 210, which maintains the hook 240 in its retracted position. As the cam 210 rotates back to its first position, first the projecting finger 228 and then the cam surface 250 act on the lug 244 to pivot the hook 240 to the extended position when the electronic module 102 is levered back to its initial position.

The handle 302 has a first end portion 304 and a second end portion 306. The handle 302 is attached at one end to the actuating lever 108 and at the other end to the actuating lever 208. The first end portion of the handle 302 is attached to the second end portion of the first actuating lever 108, and the second end portion of the handle 302 is attached to the second end portion of the second actuating lever 208 using appropriate fasteners such as screws, rivets or the like. The handle 302 is pivotally movable between a folded-down position and a fully raised position. In addition, the handle 302 can move to an intermediate position between the folded-down position and the fully raised position. The folded-down position, the fully raised position, and the intermediate position of the handle 302 correspond to the folded-down positions, the fully raised positions, and the intermediate positions of the actuating levers 108, 208.

In the illustrated example, the leverage system 300 further includes a latch 400 for securing the handle 302 and the actuating levers 108, 208 in the folded-down position. The latch 400 and the handle 302 cooperatively form the means for securing the actuating levers 108, 208 in the folded-down position. The latch 400 includes a housing 402, a pawl 404, at least one spring 406, an actuating button 408, and a hinged button cover 410. The housing 402 supports the pawl 404 for rectilinear motion between an extended position and a retracted position. The spring 406 acts between the pawl 404 and the housing 402 to bias the pawl 404 toward the extended position. The housing 402 is adapted for mounting to the front face of the electronic module 102. If the mounting brackets 106 and 206 are integrated as part of a common mounting frame, then the housing 402 would be mounted to the common mounting frame. The common mounting frame would then be adapted for mounting to the front face of the electronic module 102, for example, in the same manner as the mounting brackets 106 and 206. In the illustrated example, the housing 402 has mounting holes 412 that allow the housing 402 to be mounted to the front face 101 of the electronic module 102 using appropriate fasteners such as screws, rivets or the like.

The pawl 404 has a chisel-shaped portion 414 and a top surface 416. A portion of the top surface 416 forms a catch surface 418. The pawl 404 has a beveled surface 420 that forms an acute angle with the catch surface 418. The catch surface 418 and the beveled surface 420 together define the chisel-shaped portion 414 of the pawl 404. The pawl 404 also has a hook-like projection 422 that projects from a portion of the top surface 416 that is apart from the catch surface 418. The hook-like projection 422 has a catch surface 424 and a beveled surface 426 that forms an acute angle with the catch surface 424 of the hook-like projection 422.

The housing 402 pivotally supports the pushbutton 408 for movement between a depressed position and a rest position. The button 408 includes a pressure pad 428 and a fin 430 that projects from the underside of the pressure pad 428 and rests against a sloping cam surface 432 provided in the pawl 404. The cam surface 432 declines or slopes downward in the direction of the chisel-shaped portion 414 of the pawl 404. A tab 434 projects from the pressure pad 428 and keeps the button 408 from moving outward from the housing 402 beyond its rest position. The spring 406 also biases the button 408 toward its rest position through the interaction of the sloping cam surface 432 and the fin 430. When the button 408 is depressed by a user, the fin 430 acts on the cam surface 432 to move the pawl 404 to the retracted position. When the button 408 is released, the pawl 404 returns to its extended position and the button 408 returns to its rest position. The button cover 410 covers the button 408 in order to prevent the button 408 from being pressed accidentally. The button cover 410 is hinged to the housing 402 and has a lever portion 440 on the opposite side of the hinge axis to allow a user to move the cover 410 out of the way to permit access to the button 408 by applying finger pressure to the lever portion 440.

Figure 7:
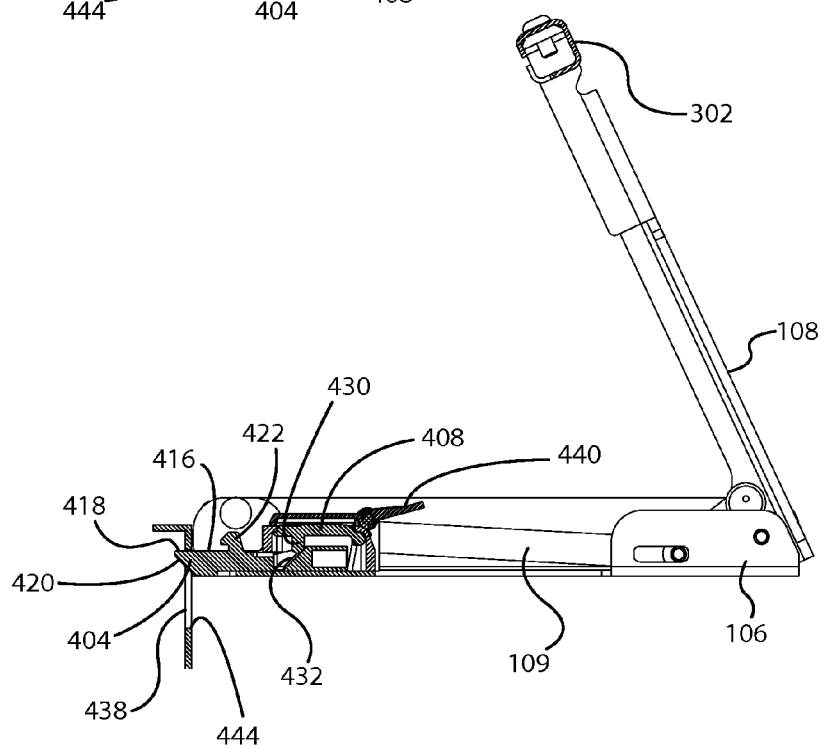
Figure 8:
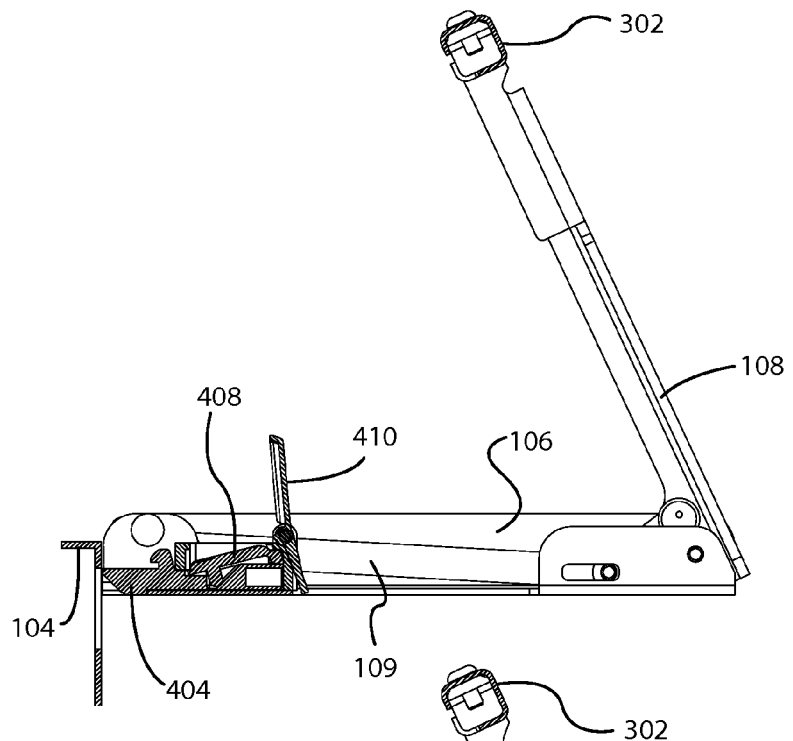
Figure 9:
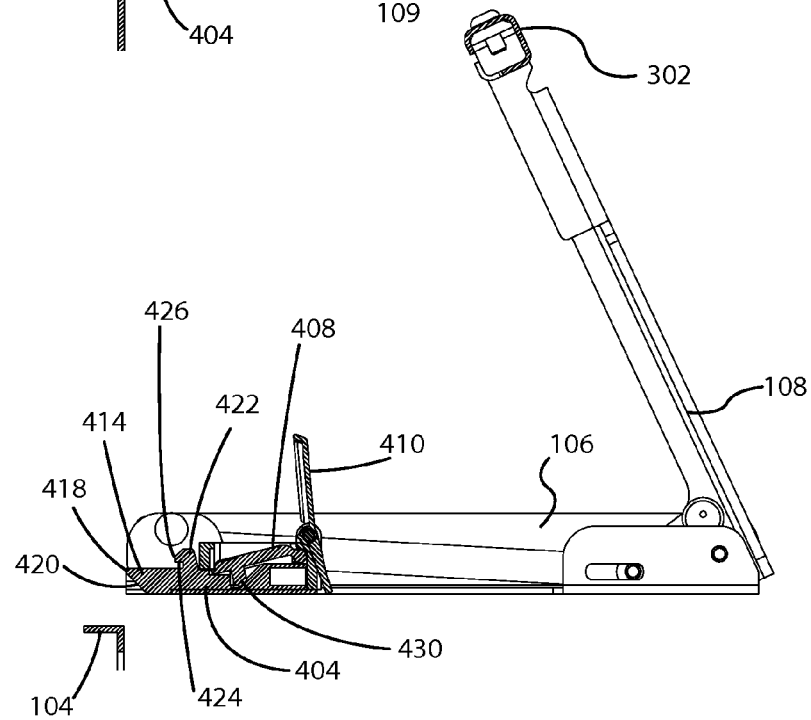
Figure 10:
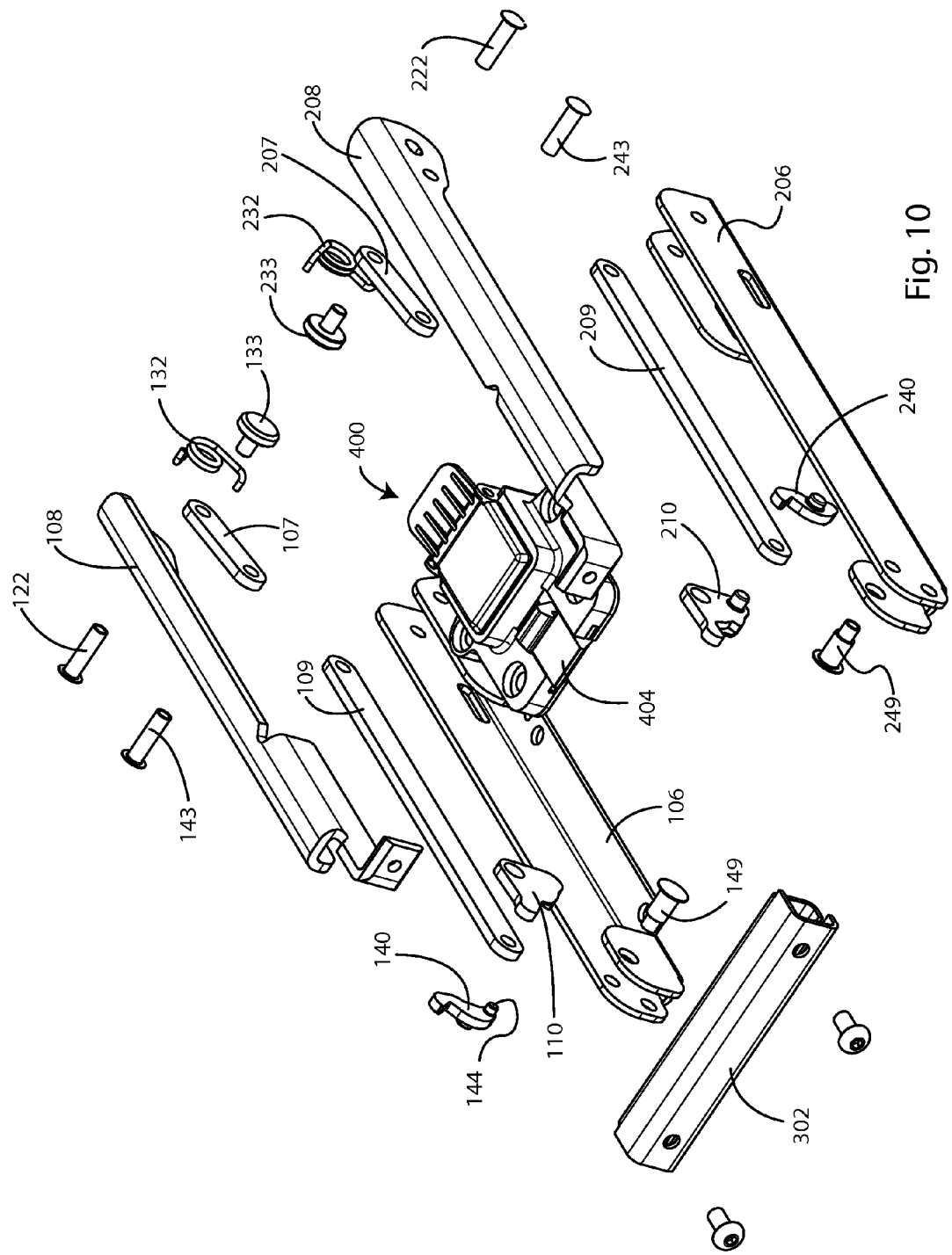
FIG. 10 is an exploded view of the leverage system of the present invention.
Figure 13:
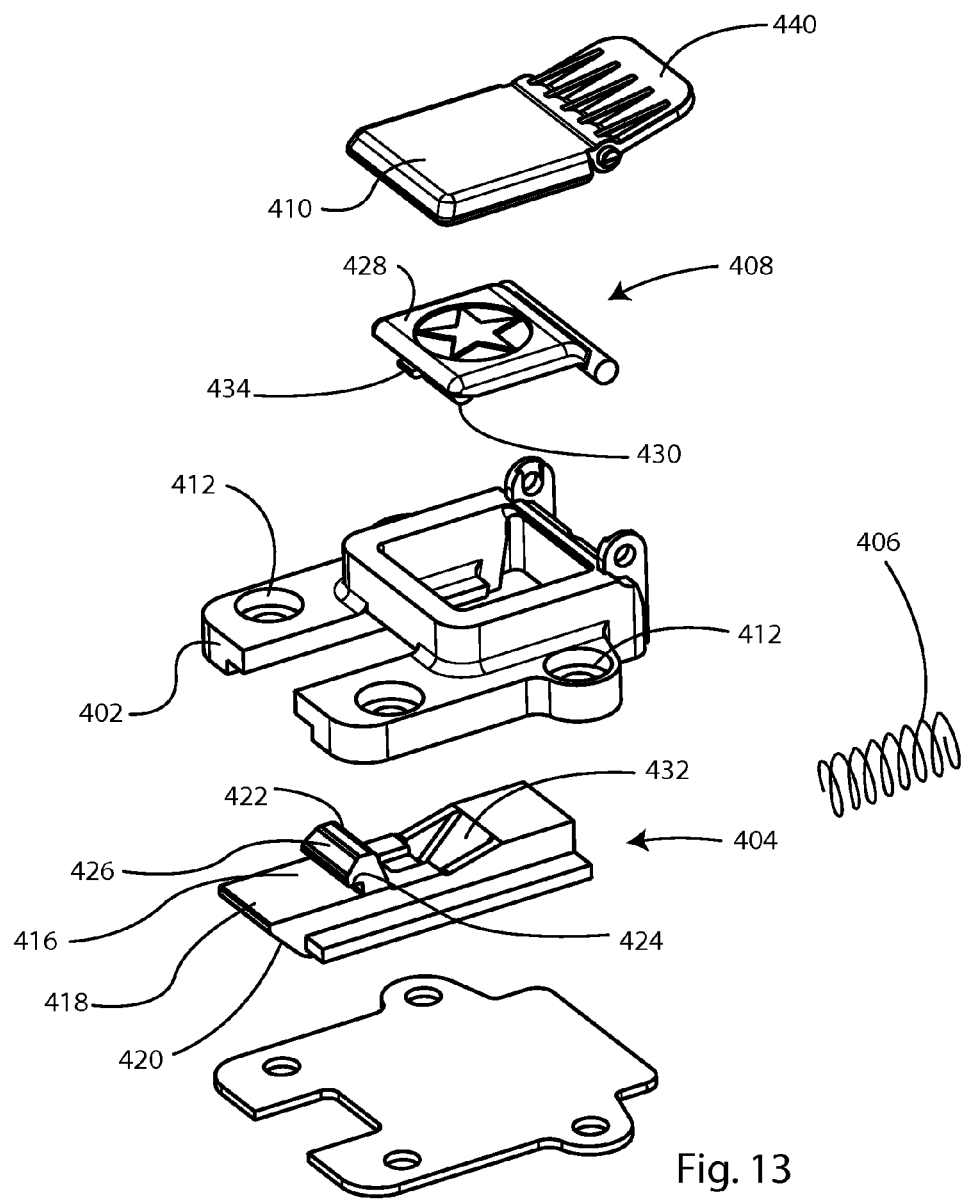
FIG. 13 is an exploded view of the secondary latch of the leverage system of the present invention.

As the electronic module 102 is inserted into its compartment in the shelf 104, the edge 436 of the shelf 104 acts on the beveled surface 420 of the pawl 404 to move the pawl 404 to the retracted position and allow the electronic module 102 to move to its initial position relative to the shelf 104 as shown in FIG. 7. Once the electronic module 102 is in its initial position relative to the shelf 104, the chisel-shaped portion 414 of the pawl 404 moves into the rectangular opening 438 in the shelf 104 and to its position corresponding to the extended position of the pawl 404. The catch surface 418 of the pawl 404 engages the outer edge 442 of the opening 438 to prevent the electronic module 102 from being pulled outward relative to the shelf 104 from its proper initial position. The inner edge 444 of the opening 438 is sufficiently far from the outer edge 442 such that the pawl 404 can remain in the extended position as the electronic module 102 moves to and reaches its final installed position relative to the shelf 104. This feature allows the hook-like projection 422 to remain available to capture the handle 302 and the actuating levers 108, 208 and to secure the handle 302 and the actuating levers 108, 208 in the folded-down position.

The handle 302 has a catch surface defined by the edge 308. As the handle 302 and the actuating levers 108, 208 move from the intermediate position to the folded-down position, the edge 308 engages and acts on the beveled surface 426 of the hook-like projection 422 to move the pawl 404 toward the retracted position and to move the hook-like projection 422 out of the way of the edge 308 so that the handle 302 and the actuating levers 108, 208 can move into the folded-down position. At this time the pawl 404 moves back to the extended position under bias of the spring 406 where the edge 308 interacts with the catch surface 424 of the hook-like projection 422 to prevent the handle 302 and the actuating levers 108, 208 from being moved out of the folded-down position and thus securing the handle 302 and the actuating levers 108, 208 in the folded-down position.

When the electronic module 102 is in operation, the actuating levers 108, 208 and the handle 302 are normally secured in the folded-down position. To remove the module 102 for repair or replacement, the user moves the cover 410 out of the way and pushes the button 408 to the depressed position. This releases the handle 302 and the actuating levers 108, 208 from the folded-down position to the intermediate position under bias of the springs 132, 232. No movement of the second linkage member 109, 209 or of the cams 110, 210 occurs during the movement of the handle 302 and the actuating levers 108, 208 between the folded-down position and the intermediate position. The intermediate position of the handle 302 and the actuating levers 108, 208 is about 18° from the folded-down position. The handle 302 can now be more easily grasped by a user even when the user is wearing a mitten or glove. The user can now grasp the handle 302 and move it to the fully raised position, which causes the electronic module 102 to be ejected from its final installed position and to be moved to its initial position by the action of the cams 110, 210 on the openings 151, 251. The fully raised position of the handle 302 and the actuating levers 108, 208 is about 47° from the intermediate position. The user once again presses the button 408 to retract the pawl 404 from the opening 438, and while holding the handle 302 and pressing button 408 the user can pull the module 102 outward until the pawl 404 is no longer aligned with the opening 438. The user can then release the button 408 and shift his or her grip as necessary and remove the module 102 from the shelf 104 using the handle 302 as an aid if desired.

To insert the module 102 into the shelf 104, the user ensures that the handle 302 is in the fully raised position. The user then aligns the module 102 with its compartment in the shelf 104 and pushes the module 102 into the shelf 104 until he or she hears the pawl 404 click into the opening 438. The module 102 is now in its proper initial position. Then the user moves the handle 302 from the fully raised position to the intermediate position to lever the module 102 to its final installed position where the electrical connectors at the back of the module 102 are fully inserted into mating connectors in the shelf 104. The user can then move the handle 302 to the folded-down position where it is captured and secured by the hook-like projection 422. The leverage system 300 produces an insertion force on the order of several hundred pounds from a force of a few tens of pounds applied to the handle 302. In the illustrated example, a force of 30 pounds applied to fold down the handle 302 generates an insertion force of 475 pounds.

It is to be understood that the present invention is not limited to the embodiments described above, but encompasses any and all embodiments within the scope of the following claims.

The invention claimed is:

1. A leverage device comprising:
   (a) an elongated mounting bracket having a first end portion and a second end portion;
   (b) an actuating lever having a first end portion and a second end portion, said actuating lever being pivotally attached at said first end portion thereof to said first end portion of said mounting bracket to thereby form a pivotal attachment between said actuating lever and said mounting bracket;
   (c) a first linkage member having a first end portion and a second end portion, said first linkage member being pivotally attached at said first end portion thereof to said actuating lever, said first linkage member being pivotally attached to said actuating lever at a location spaced apart from said pivotal attachment between said actuating lever and said mounting bracket;
   (d) a second linkage member having a first end portion and a second end portion, said second linkage member being pivotally attached at said first end portion thereof to said second end portion of said first linkage member to thereby form a pivotal attachment between said first linkage member and said second linkage member, said pivotal attachment between said first linkage member and said second linkage member being supported for rectilinear motion relative to said mounting bracket by said mounting bracket;
   (e) a cam having a projecting finger and being rotationally supported by said mounting bracket at said second end portion of said mounting bracket for rotational motion about an axis of rotation, said second linkage member being pivotally attached at said second end portion thereof to said cam at a location offset from said axis of rotation of said cam,
   wherein pivotal movement of said actuating lever between a folded-down position and a fully raised position causes rotation of said cam between a first position and a second position.

2. The leverage device of claim 1, wherein said mounting bracket is adapted for mounting to a first member and wherein said cam is capable of engaging a second member such that the leverage device forces the first member into a final installed position relative to the second member during movement of said actuating lever from said fully raised position to said folded-down position.

3. The leverage device of claim 2, wherein said projecting finger of said cam engages an opening in the second member.

4. The leverage device of claim 2, wherein said mounting bracket is a first mounting bracket, said actuating lever is a first actuating lever, and said cam is a first cam, and said leverage device further comprises:
   a second elongated mounting bracket having a first end portion and a second end portion;
   a second actuating lever having a first end portion and a second end portion, said second actuating lever being pivotally attached at said first end portion thereof to said first end portion of said second mounting bracket to thereby form a pivotal attachment between said second actuating lever and said second mounting bracket;
   a third linkage member having a first end portion and a second end portion, said third linkage member being pivotally attached at said first end portion thereof to said second actuating lever, said third linkage member being pivotally attached to said second actuating lever at a location spaced apart from said pivotal attachment between said second actuating lever and said second mounting bracket;
   a fourth linkage member having a first end portion and a second end portion, said fourth linkage member being pivotally attached at said first end portion thereof to said second end portion of said third linkage member to thereby form a pivotal attachment between said third linkage member and said fourth linkage member, said pivotal attachment between said third linkage member and said fourth linkage member being supported for rectilinear motion relative to said second mounting bracket by said second mounting bracket;
   a second cam having a projecting finger and being rotationally supported by said second mounting bracket at said second end portion of said second mounting bracket for rotational motion about an axis of rotation, said fourth linkage member being pivotally attached at said second end portion thereof to said second cam at a location offset from said axis of rotation of said second cam; and
   a handle extending between said second end portion of said first actuating lever and said second end portion of said second actuating lever such that said handle, said first actuating lever, and said second actuating lever move as a unit,
   wherein pivotal movement of said handle, said first actuating lever, and said second actuating lever between a folded-down position and a fully raised position causes rotation of each of said first cam and said second cam between a first position and a second position.

5. The leverage device of claim 2, wherein said actuating lever is pivotally attached to said mounting bracket by a pin passing through an elongated opening provided in said first end portion of said actuating lever such that said actuating lever can move between said folded-down position and an intermediate position without causing any movement of said second linkage member and of said cam.

6. The leverage device of claim 4, wherein said handle, said first actuating lever, and said second actuating lever form a lever assembly, wherein said first actuating lever is pivotally attached to said first mounting bracket by a first pin passing through a first elongated opening provided in said first end portion of said first actuating lever, and wherein said second actuating lever is pivotally attached to said second mounting bracket by a second pin passing through a second elongated opening provided in said first end portion of said second actuating lever,
   such that said lever assembly can move between said folded-down position and an intermediate position without causing any movement of said second linkage member, said first cam, said fourth linkage member, and said second cam.

7. The leverage device of claim 6, further comprising a push-button latch that is capable of attachment to the first member and engaging said handle to selectively secure said lever assembly in said folded-down position.

8. The leverage device of claim 7, said push-button latch further comprising a pawl that is capable of engaging the second member when said lever assembly is in said fully raised position so as to aid in maintaining the first member in a proper position relative to the second member for engagement of the first and second cams with the second member as the lever assembly is moved to the folded-down position.

* * * * *